US011322459B2

(12) United States Patent
Furutani

(10) Patent No.: US 11,322,459 B2
(45) Date of Patent: May 3, 2022

(54) LEAD OF SEMICONDUCTOR DEVICE HAVING A SIDE SURFACE WITH A PLURALITY OF RECESS AREAS

(71) Applicant: ROHM CO., LTD., Kyoto (JP)

(72) Inventor: Ryuichi Furutani, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/971,584

(22) PCT Filed: Mar. 8, 2019

(86) PCT No.: PCT/JP2019/009388
§ 371 (c)(1),
(2) Date: Aug. 20, 2020

(87) PCT Pub. No.: WO2019/176783
PCT Pub. Date: Sep. 19, 2019

(65) Prior Publication Data
US 2020/0388580 A1      Dec. 10, 2020

(30) Foreign Application Priority Data
Mar. 12, 2018 (JP) .............................. JP2018-044025

(51) Int. Cl.
*H01L 23/495*       (2006.01)
*H01L 23/48*        (2006.01)
(Continued)

(52) U.S. Cl.
CPC ............ *H01L 23/562* (2013.01); *H01L 21/56* (2013.01); *H01L 23/3107* (2013.01);
(Continued)

(58) Field of Classification Search
CPC .......... H01L 23/3121; H01L 23/49503; H01L 23/4952; H01L 23/49562; H01L 23/49568;
(Continued)

(56) References Cited

U.S. PATENT DOCUMENTS 4,460,917 A * 7/1984 Rogers .................... H01L 23/32
174/153 G
9,397,037 B2 * 7/2016 Yasunaga ............ H01L 23/3142
(Continued)

FOREIGN PATENT DOCUMENTS

JP       59-88857 A       5/1984
JP    2003-332512 A     11/2003
(Continued)

OTHER PUBLICATIONS

International Search Report issued in PCT/JP2019/009388, dated May 21, 2019 (2 pages).

*Primary Examiner* — Alonzo Chambliss
(74) *Attorney, Agent, or Firm* — Hamre, Schumann, Mueller & Larson, P.C.

(57) ABSTRACT

A semiconductor device includes a lead, a first semiconductor element, and a sealing resin that covers at least a portion of each of the lead and the first semiconductor element. The lead has an obverse surface on which the first semiconductor element is mounted, and a reverse surface opposite to the obverse surface. The lead includes a first portion having a first surface. The first surface is located between the obverse surface and the reverse surface in the z direction in which the obverse surface and the reverse surface are separated from each other. The first surface of the lead is covered with the sealing resin, and is configured with a plurality of protruding areas and a plurality of recessed areas arranged alternately as viewed in the z direction.

17 Claims, 23 Drawing Sheets

(51) Int. Cl.
*H01L 23/28* (2006.01)
*H01L 21/00* (2006.01)
*H05K 5/02* (2006.01)
*H01L 23/00* (2006.01)
*H01L 23/31* (2006.01)
*H01L 21/56* (2006.01)
*H01L 23/367* (2006.01)

(52) U.S. Cl.
CPC ...... *H01L 23/3121* (2013.01); *H01L 23/3675* (2013.01); *H01L 23/4952* (2013.01); *H01L 23/49503* (2013.01); *H01L 23/49562* (2013.01); *H01L 23/49568* (2013.01); *H01L 23/49575* (2013.01)

(58) Field of Classification Search
CPC ......... H01L 23/49575; H01L 23/49541; H01L 23/28; H01L 23/3675; H01L 24/49; H01L 21/56
See application file for complete search history.

(56) References Cited

U.S. PATENT DOCUMENTS

| | | | |
|---|---|---|---|
| 9,653,377 B2* | 5/2017 | Yasunaga | H01L 23/3142 |
| 10,083,900 B2* | 9/2018 | Yasunaga | H01L 23/4334 |
| 10,825,758 B2* | 11/2020 | Yasunaga | H01L 23/49582 |
| 2013/0062745 A1* | 3/2013 | Kimura | H01L 23/293 257/675 |
| 2014/0284783 A1* | 9/2014 | Sayama | H01L 23/49503 257/690 |
| 2014/0284784 A1* | 9/2014 | Yasunaga | H01L 23/49568 257/690 |

FOREIGN PATENT DOCUMENTS

| | | |
|---|---|---|
| JP | 2010-171104 A | 8/2010 |
| JP | 2011-243839 A | 12/2011 |
| JP | 2013-145825 A | 7/2013 |
| JP | 2014-207430 A | 10/2014 |

* cited by examiner

LEAD OF SEMICONDUCTOR DEVICE HAVING A SIDE SURFACE WITH A PLURALITY OF RECESS AREAS

TECHNICAL FIELD

The present disclosure relates to a semiconductor device and a mounting structure for a semiconductor device.

BACKGROUND ART

Patent document 1 discloses a conventional semiconductor device. The disclosed semiconductor device includes a lead, a semiconductor element mounted on the lead, and a sealing resin covering the lead and the semiconductor element.

TECHNICAL REFERENCE

Patent Document

Patent Document 1: JP-A-2011-243839

SUMMARY OF THE INVENTION

Problems to be Solved by the Invention

In general, a semiconductor element generates heat by energization. In addition, when mounting a resin-packaged semiconductor device on a circuit board, for example, stress may occur within the semiconductor device due to the mounting process. Such heat and stress may cause a defect such as a crack in the sealing resin.

The present disclosure has been conceived under the foregoing circumstances. An object of the present disclosure is to provide a semiconductor device capable of improving the reliability of a sealing resin by preventing or suppressing the occurrence of a defect as described above in the sealing resin.

Means for Solving the Problems

A semiconductor device provided by the present disclosure includes a first lead, a first semiconductor element, and a sealing resin covering at least a portion of each of the first lead and the first semiconductor element. The first lead includes a first lead first portion that has: a first lead obverse surface on which the first semiconductor element is mounted; a first lead reverse surface opposite to the first lead obverse surface; and a first lead first surface located between the first lead obverse surface and the first lead reverse surface in a thickness direction in which the first lead obverse surface and the first lead reverse surface are separated apart from each other. The first lead first surface is covered with the sealing resin, and is formed with a plurality of protruding areas and a plurality of recessed areas arranged alternately as viewed in the thickness direction.

Advantages of the Invention

According to the present disclosure, the reliability of the sealing resin can be improved.

Other features and advantages of the present disclosure will become apparent from the detailed description given below with reference to the accompanying drawings.

MODE FOR CARRYING OUT THE INVENTION

Figure 1:
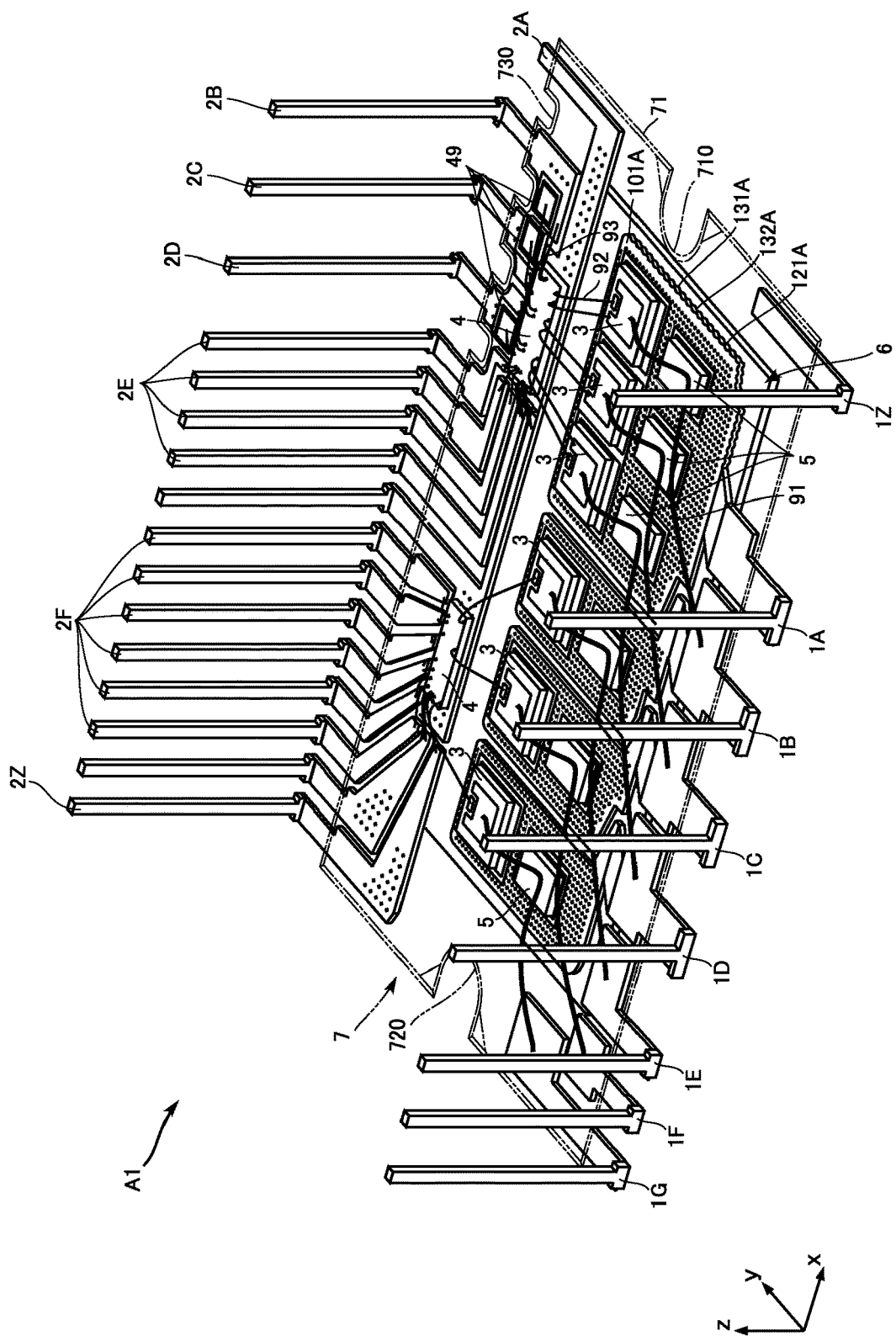
FIG. 1 is a perspective view for describing a semiconductor device according to a first embodiment.

The following describes embodiments of the present disclosure with reference to the drawings.

The terms "first", "second", "third", and the like in the present disclosure are used merely to distinguish objects, and are not intended to impose any ordinal requirements.

First Embodiment; Semiconductor Device A1

FIGS. 1 to 19 show a semiconductor device according to a first embodiment. A semiconductor device A1 shown in the figures includes a plurality of leads 1 and 2, a plurality of first semiconductor elements 3, a plurality of second semiconductor elements 4, a plurality of third semiconductor elements 5, a plurality of electronic components 49, a plurality of wires 91, 92, and 93, a supporting member 6, and a sealing resin 7. The application of the semiconductor device A1 is not particularly limited. For example, the semiconductor device A1 is configured as an intelligent power module (IPM) used for drive control of an inverter motor.

Figure 2:
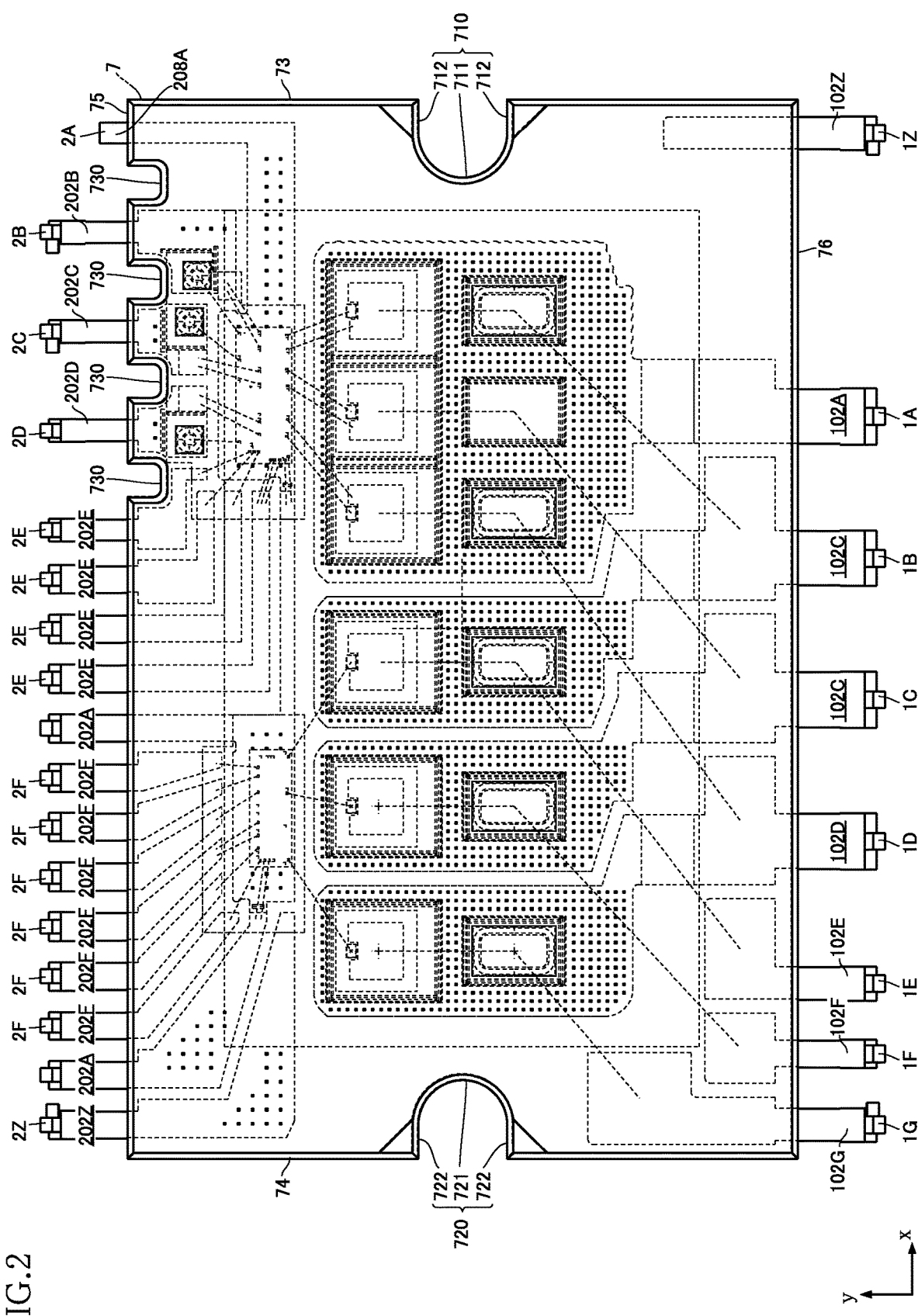
FIG. 2 is a plan view showing the semiconductor device according to the first embodiment.
Figure 3:
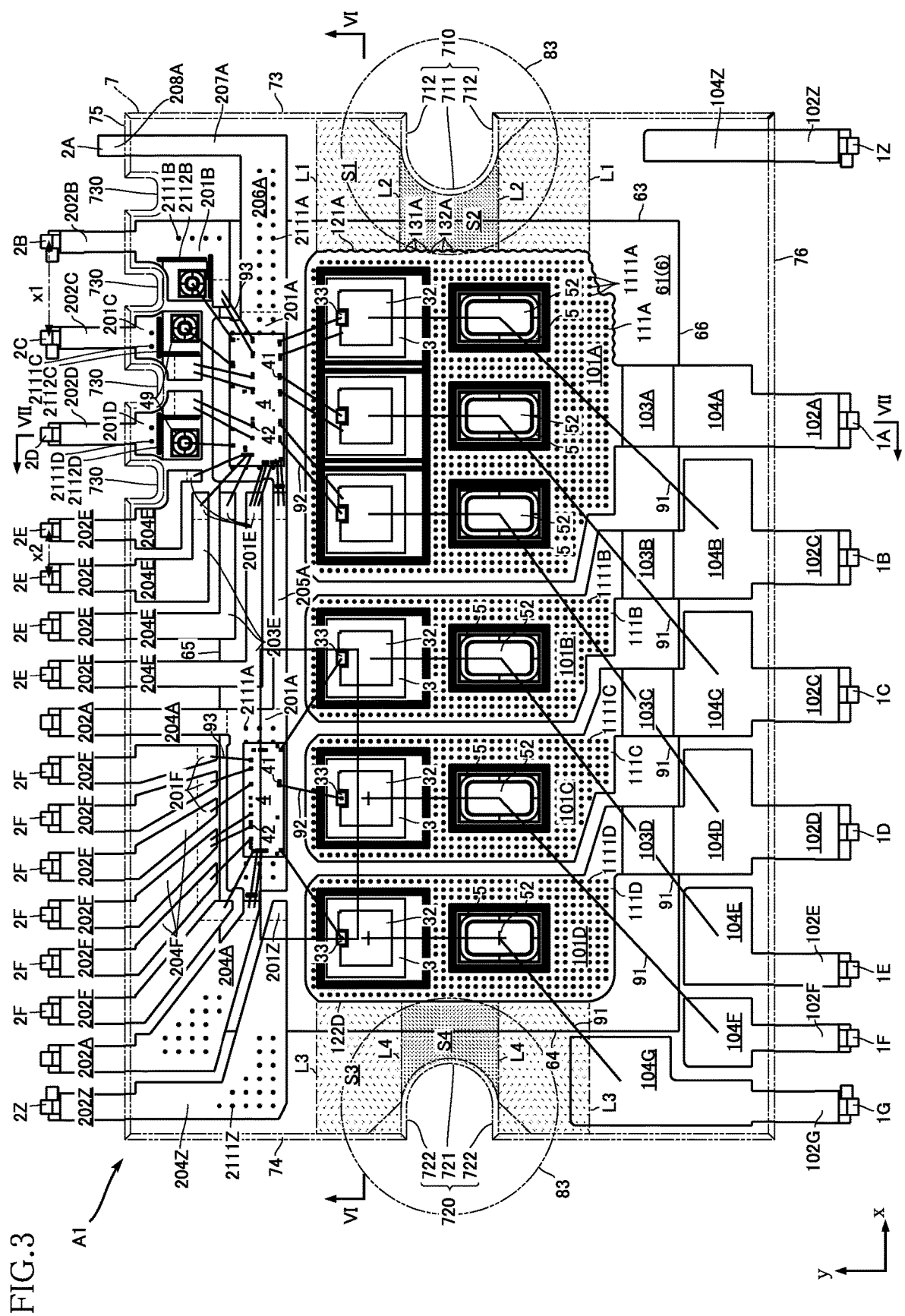
FIG. 3 is a plan view for describing the semiconductor device according to the first embodiment.
Figure 4:
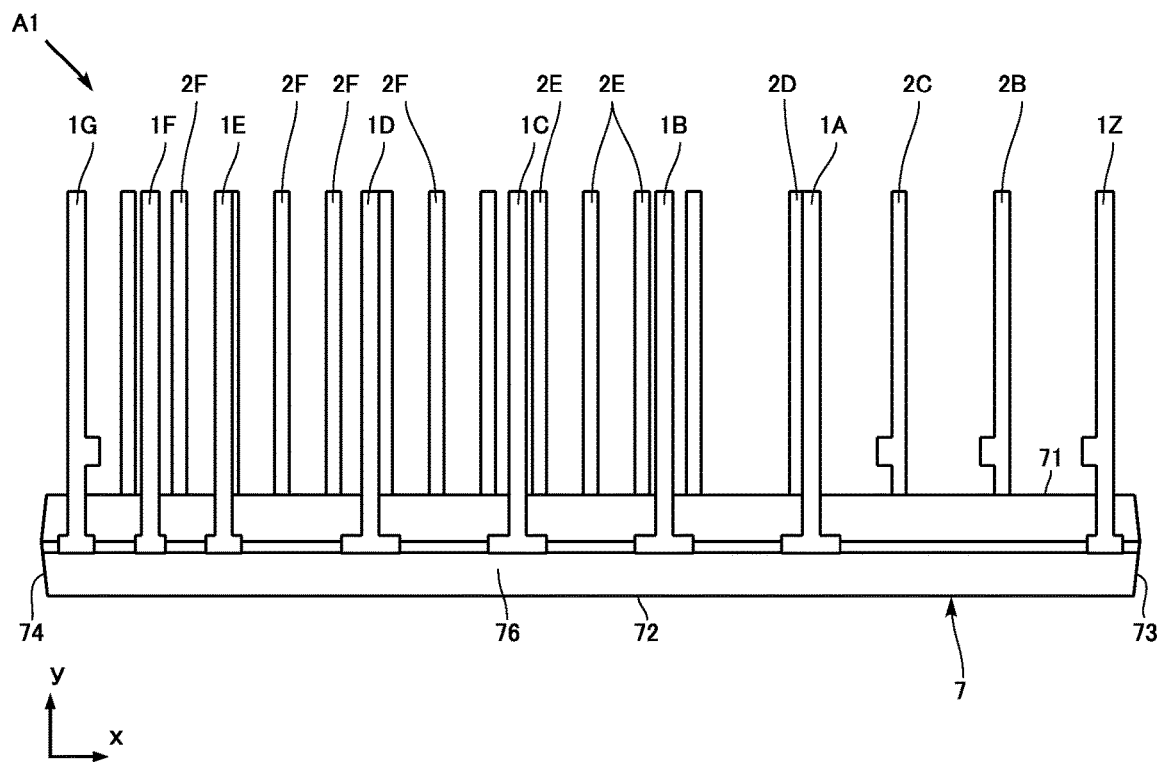
FIG. 4 is a front view showing the semiconductor device according to the first embodiment.
Figure 5:
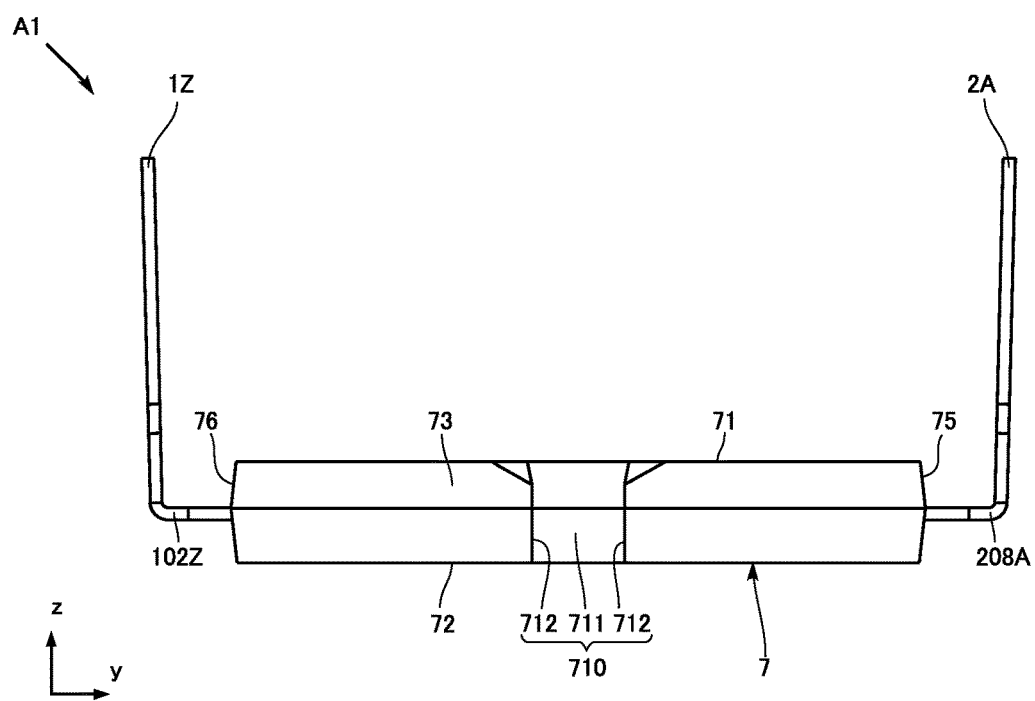
FIG. 5 is a side view showing the semiconductor device according to the first embodiment.
Figure 6:
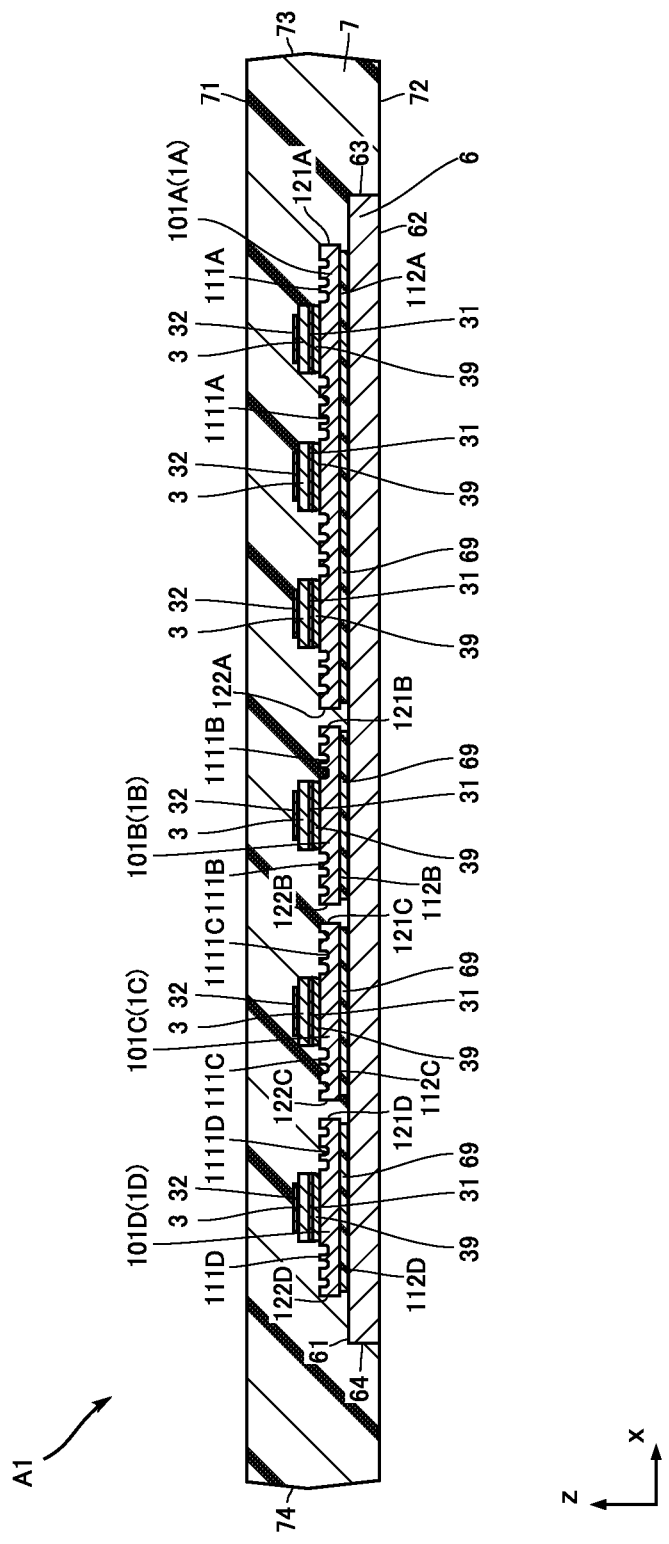
FIG. 6 is a cross-sectional view along line VI-VI in FIG. 3.
Figure 7:
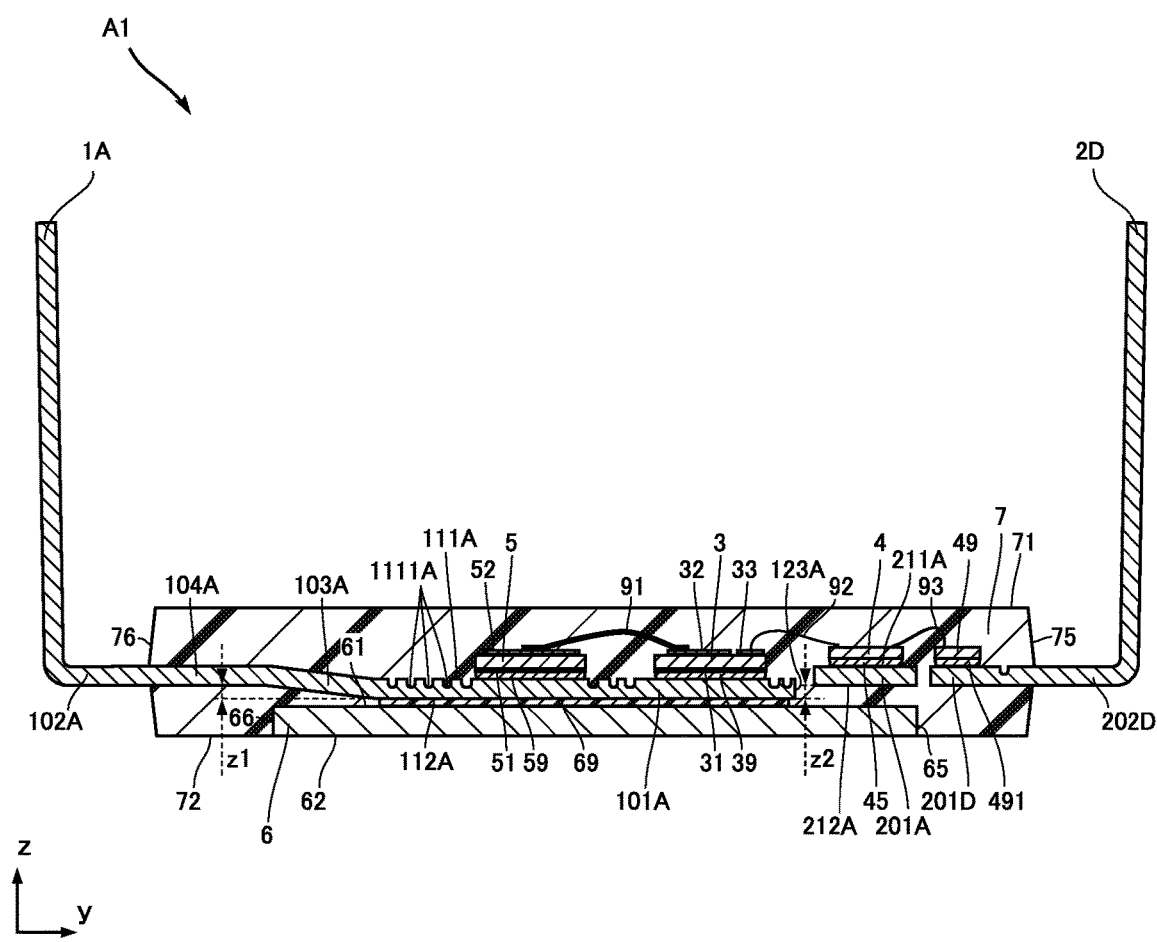
FIG. 7 is a cross-sectional view along line VII-VII in FIG. 3.
Figure 8:
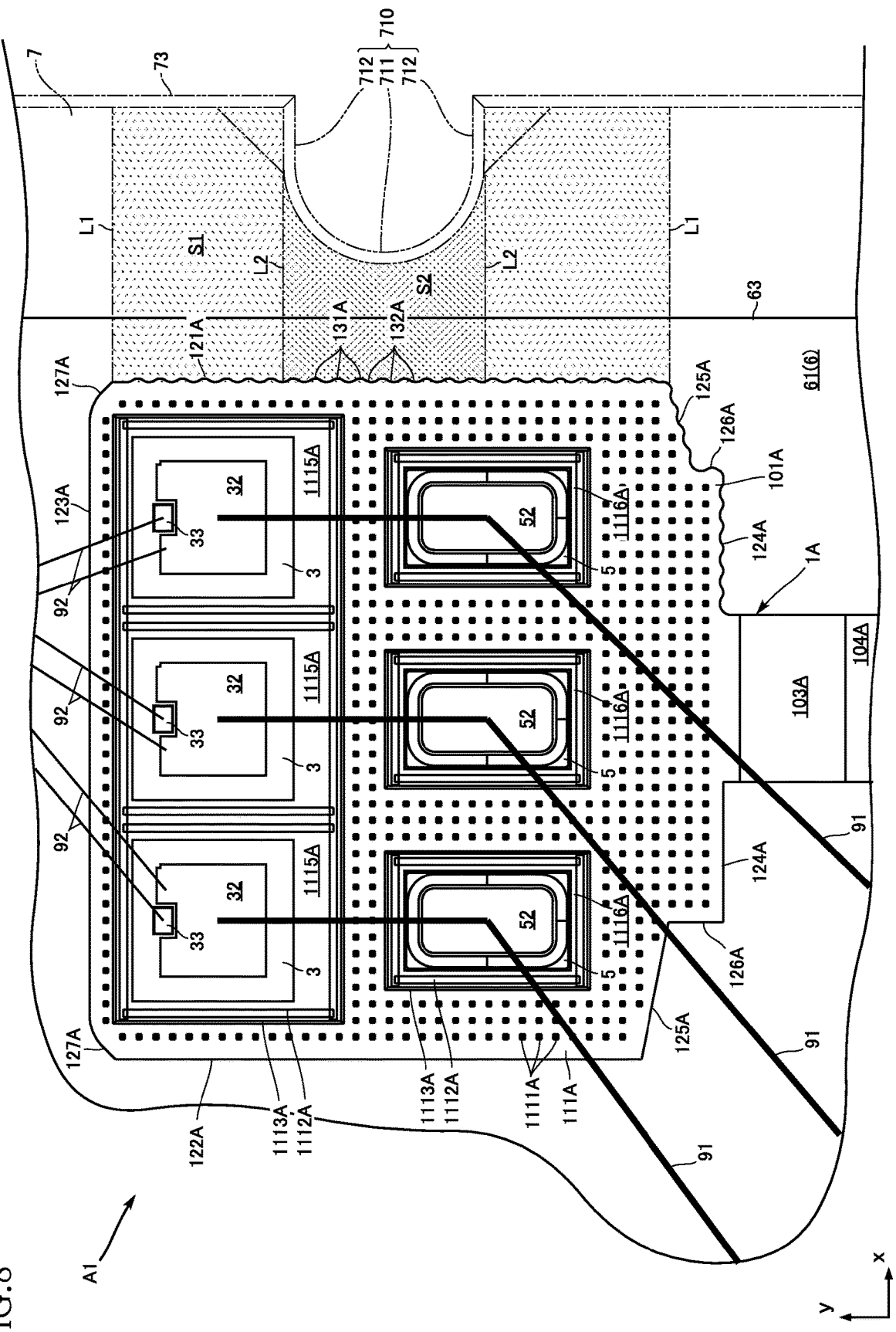
FIG. 8 is a plan view for describing the semiconductor device according to the first embodiment.
Figure 9:
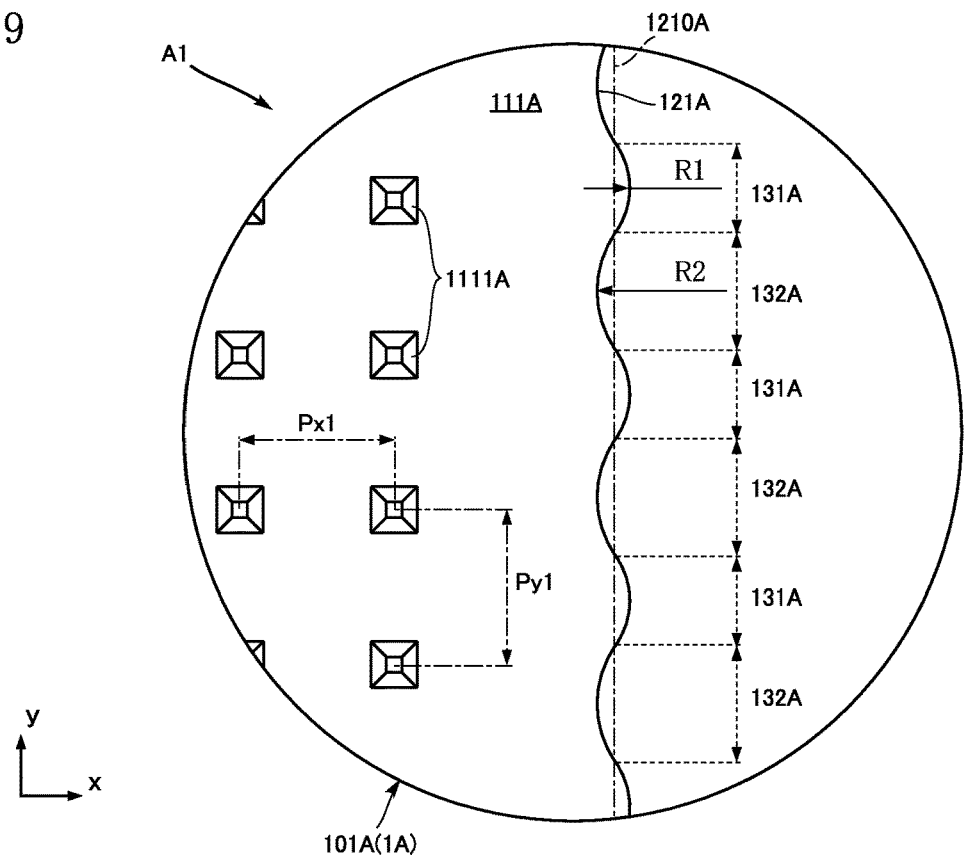
FIG. 9 is a plan view for describing the semiconductor device according to the first embodiment.
Figure 10:
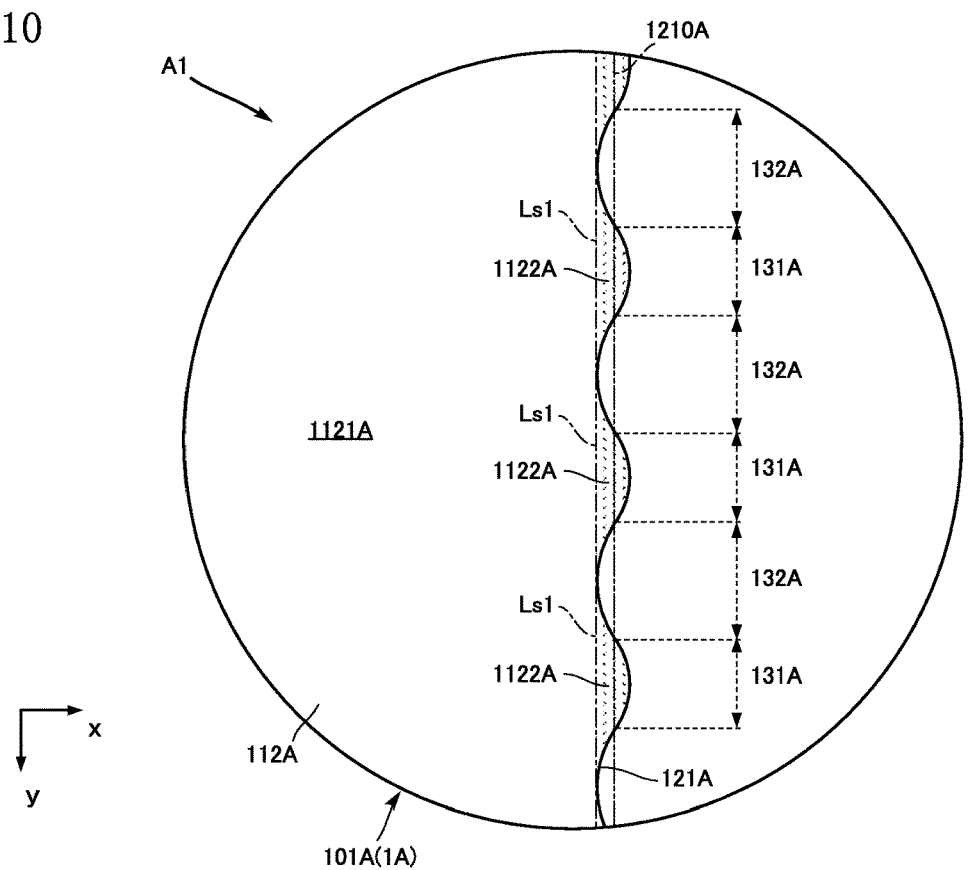
FIG. 10 is a bottom view for describing the semiconductor device according to the first embodiment.
Figure 11:
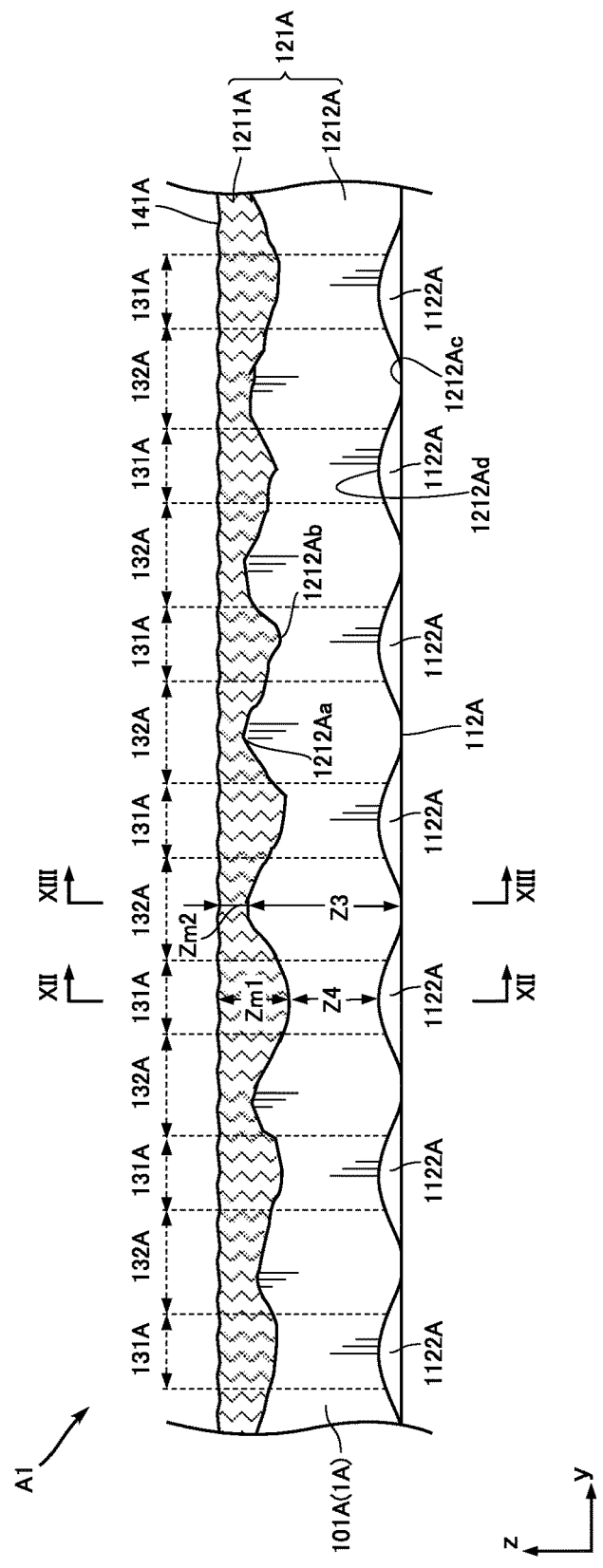
FIG. 11 is a side view for describing the semiconductor device according to the first embodiment.
Figure 12:
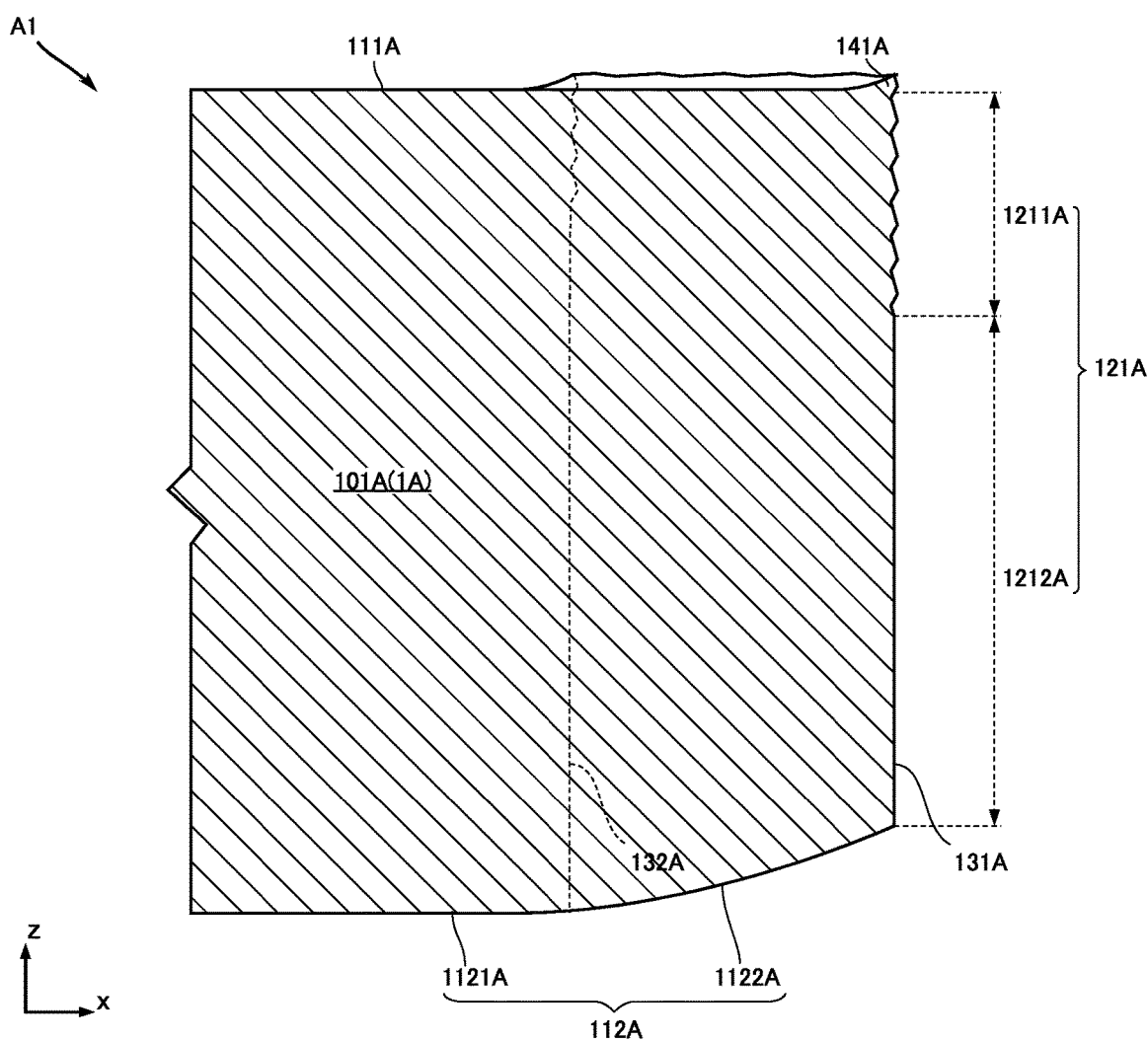
FIG. 12 is a cross-sectional view along line XII-XII in FIG. 11.
Figure 13:
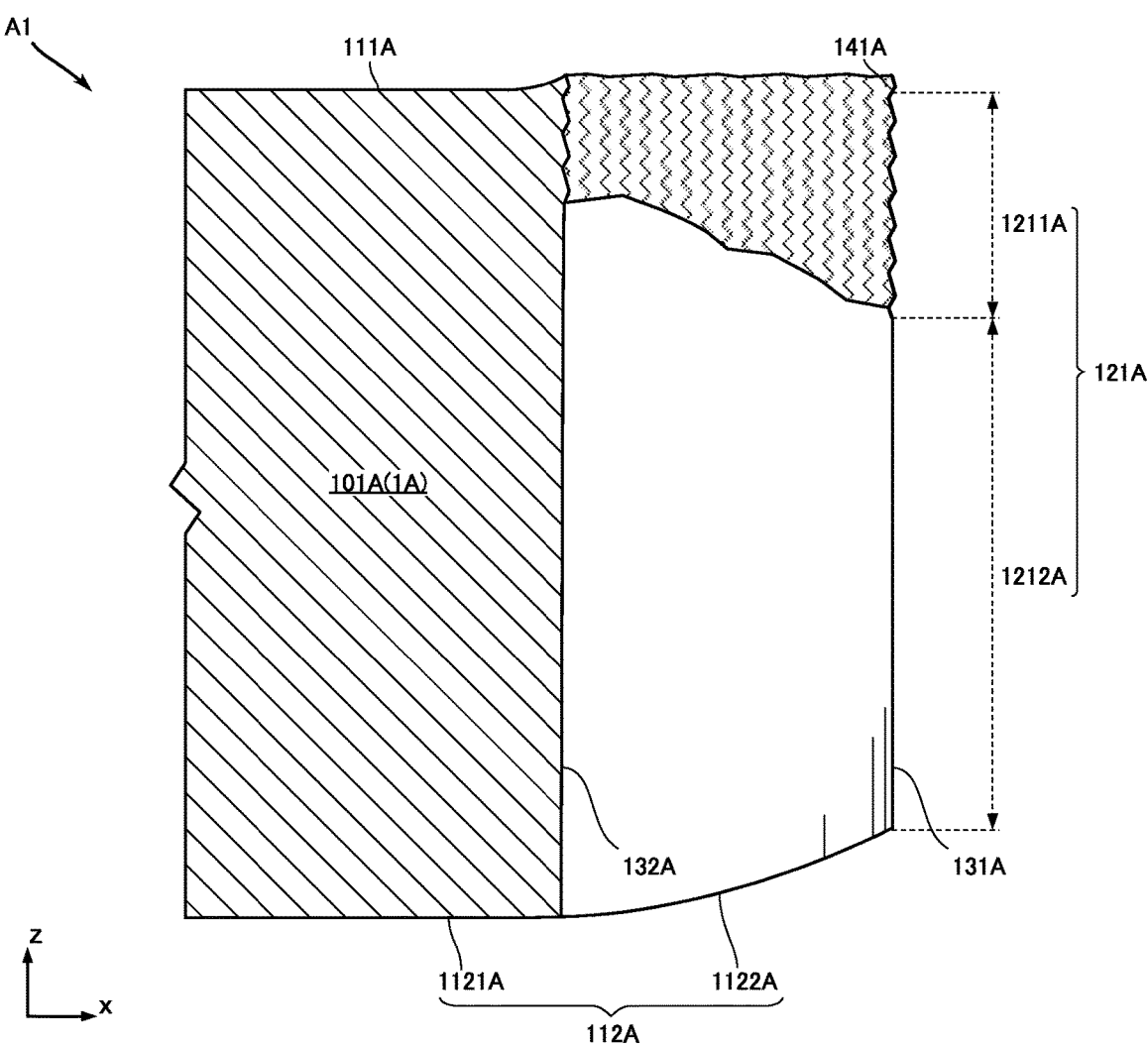
FIG. 13 is a cross-sectional view along line XIII-XIII in FIG. 11.
Figure 14:
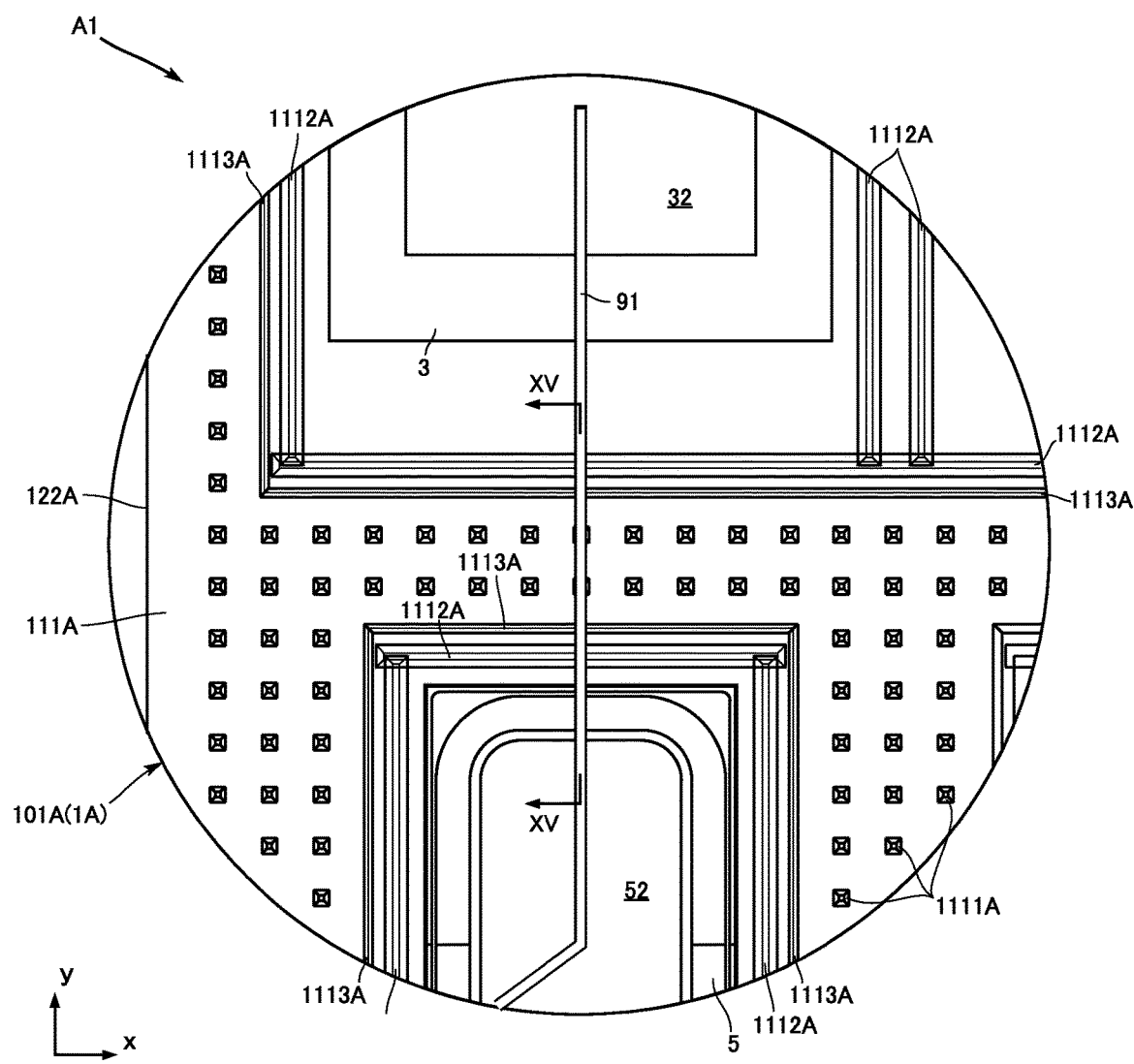
FIG. 14 is a plan view for describing the semiconductor device according to the first embodiment.
Figure 15:
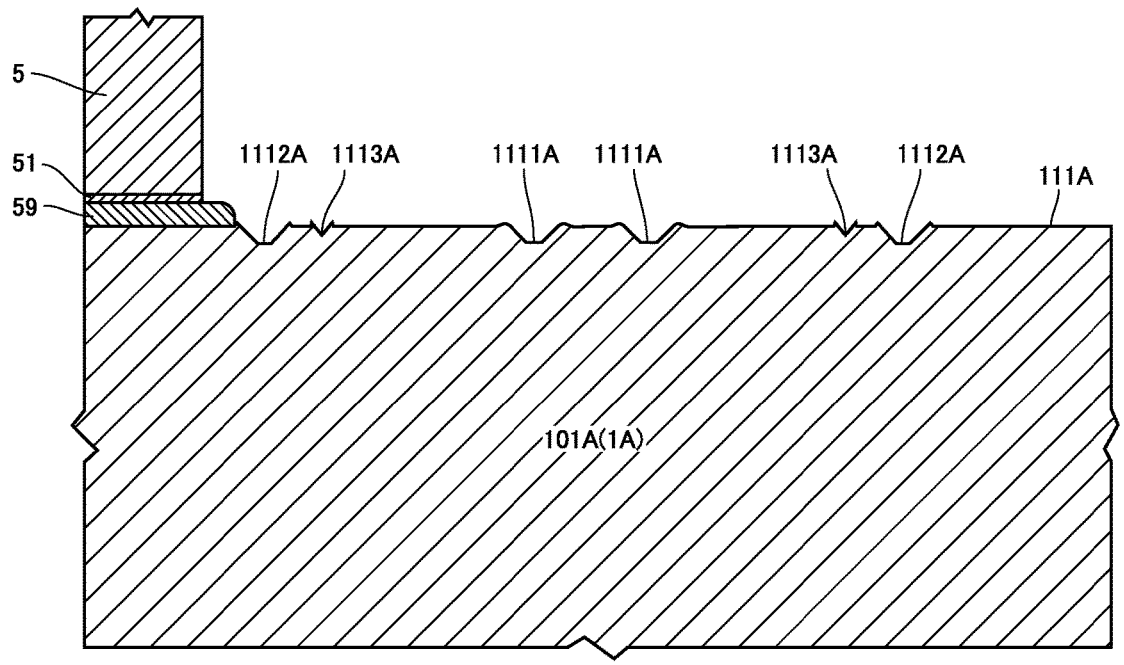
FIG. 15 is a cross-sectional view along line XV-XV in FIG. 14.
Figure 16:
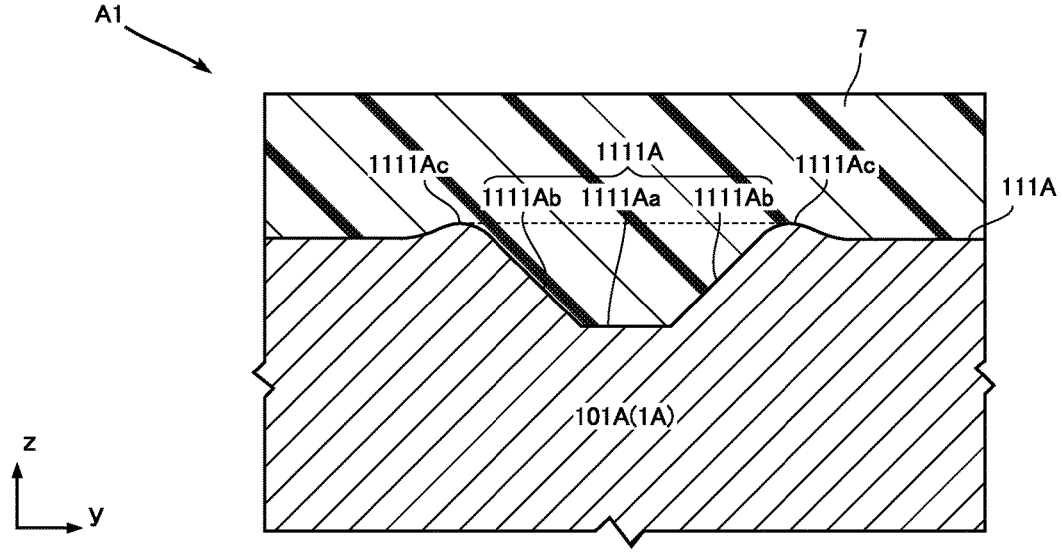
FIG. 16 is a cross-sectional view for describing the semiconductor device according to the first embodiment.
Figure 17:
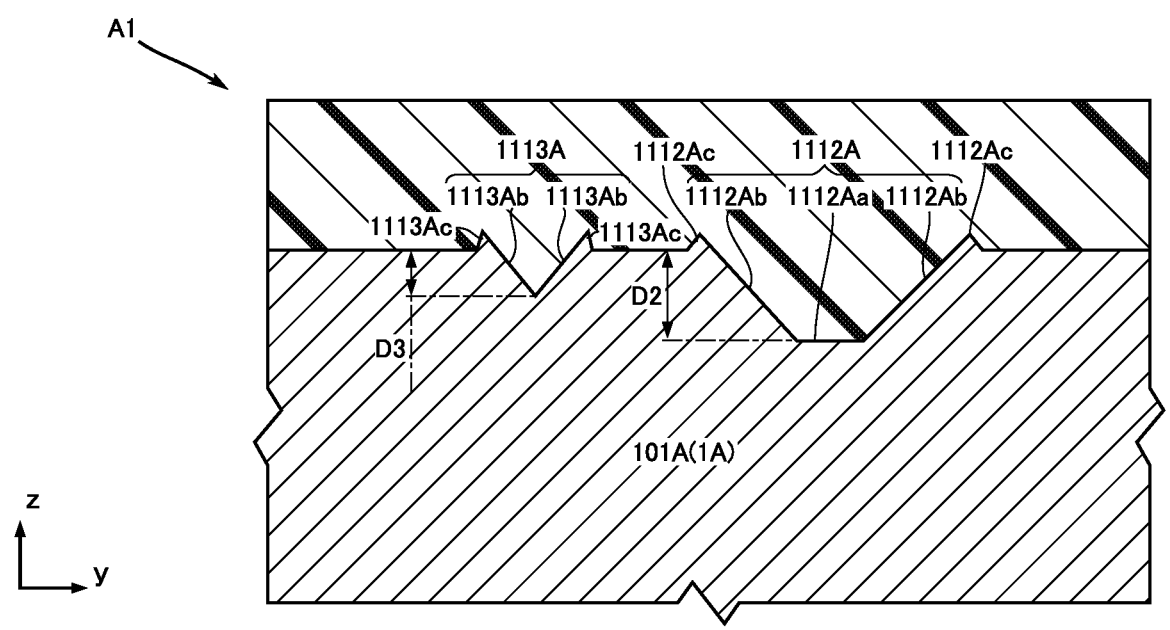
FIG. 17 is a cross-sectional view for describing the semiconductor device according to the first embodiment.
Figure 18:
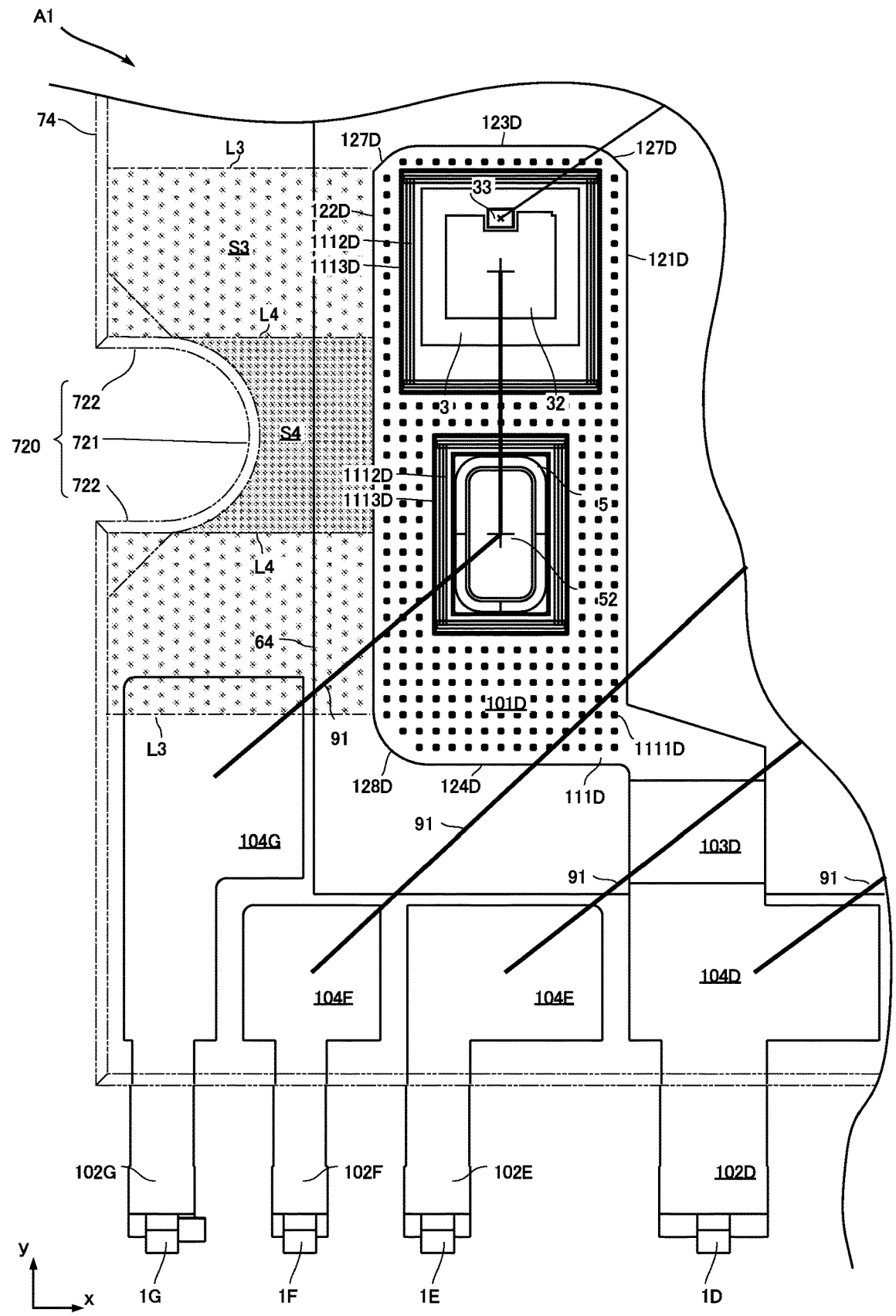
FIG. 18 is a plan view for describing the semiconductor device according to the first embodiment.
Figure 19:
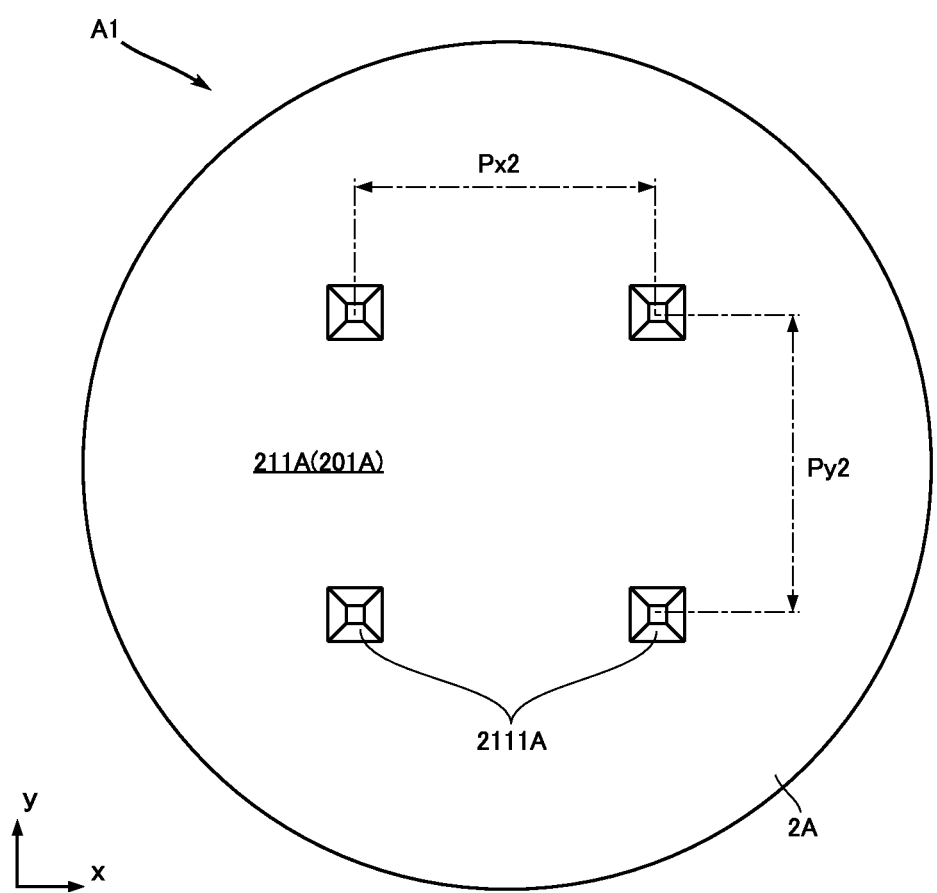
FIG. 19 is a plan view for describing the semiconductor device according to the first embodiment.

FIG. 1 is a perspective view for describing the semiconductor device A1. FIG. 2 is a plan view showing the semiconductor device A1. FIG. 3 is a plan view for describing the semiconductor device A1. FIG. 4 is a front view showing the semiconductor device A1. FIG. 5 is a side view showing the semiconductor device A1. FIG. 6 is a cross-sectional view along line VI-VI in FIG. 3. FIG. 7 is a cross-sectional view along line VII-VII in FIG. 3. FIG. 8 is a plan view for describing the semiconductor device A1. FIG. 9 is a plan view for describing the semiconductor device A1. FIG. 10 is a bottom view for describing the semiconductor device A1. FIG. 11 is a side view for describing the semiconductor device A1. FIG. 12 is a cross-sectional view along line XII-XII in FIG. 11. FIG. 13 is a cross-sectional view along line XIII-XIII in FIG. 11. FIG. 14 is a plan view for describing the semiconductor device A1. FIG. 15 is a cross-sectional view along line XV-XV in FIG. 14. FIG. 16 is a cross-sectional view for describing the semiconductor device A1. FIG. 17 is a cross-sectional view for describing the semiconductor device A1. FIG. 18 is a plan view for describing the semiconductor device A1. FIG. 19 is a plan view for describing the semiconductor device A1.

The plurality of leads 1 and 2 support the plurality of first semiconductor elements 3, the plurality of second semiconductor elements 4, and the plurality of third semiconductor elements 5, and form a conductive path to these semiconductor elements. The leads 1 and 2 are conductive members, and may be formed with the use of a lead frame, for example. The voltage applied to the plurality of leads 1 is higher than the voltage applied to the plurality of leads 2, but the present disclosure is not limited to such. For example, if the semiconductor device A1 is configured as an IPM, a drive current for a motor is fed to the plurality of leads 1 and a control current is fed to the plurality of leads 2. Accordingly, a higher voltage is applied to the plurality of leads 1 than to the plurality of leads 2, and a larger current flows through the plurality of leads 1. As such, the plurality of leads 1 may be referred to as "high voltage leads" or "power leads", and the plurality of leads 2 as "low voltage leads" or "control leads". The plurality of leads 1 and 2 may be formed by cutting and bending a metal (e.g., Cu) plate material through a punching operation, for example.

The plurality of leads 1 include leads 1A to 1G, and 1Z. The plurality of leads 2 include leads 2A to 2F, and 2Z.

As shown in FIG. 3, the group of leads 1A to 1G and 1Z is separated from the group of leads 2A to 2F and 2Z in the y direction.

The leads 1A to 1G and 1Z take different forms as appropriate in terms of shape, position, and conductive relationship with semiconductor elements. The following describes individual leads 1 while descriptions on common features are omitted as appropriate.

As shown in FIGS. 1, 3, 4, and 6 to 8, the lead 1A ("first lead") has a first portion 101A, a second portion 102A, a third portion 103A, and a fourth portion 104A.

The first portion 101A has an obverse surface 111A, a reverse surface 112A, a first surface 121A, a second surface 122A, a third surface 123A, a pair of fourth surfaces 124A, a pair of fifth surfaces 125A, a pair of sixth surfaces 126A, a pair of seventh surfaces 127A, a plurality of recesses 1111A, a plurality of grooves 1112A, and a plurality of grooves 1113A.

The obverse surface 111A faces a first side in the z direction, and is flat except the plurality of recesses 1111A (hereinafter, a surface that is flat as a whole even if the surface is formed with a plurality of recesses is referred to as a "flat surface"). The reverse surface 112A is a flat surface that faces the side opposite from the obverse surface 111A in the z direction. The first semiconductor elements 3 and the third semiconductor elements 5 are mounted on the obverse surface 111A. In the illustrated example, three first semiconductor elements 3 and three third semiconductor elements 5 are mounted on the obverse surface 111A of the first portion 101A, but the number of semiconductor elements is not limited to this example. The third semiconductor elements 5 may not be mounted on the first portion 101A.

The first surface 121A is located between the obverse surface 111A and the reverse surface 112A in the z direction, and faces a first side in the x direction (right side in FIG. 3) as a whole. The first surface 121A is connected to the obverse surface 111A and the reverse surface 112A. As shown in FIGS. 8 to 10, the first surface 121A has a plurality of protruding areas 131A and a plurality of recessed areas 132A. Each of the protruding areas 131A has a protruding shape as viewed in the z direction, and protrudes in the x direction (right side in FIG. 9). Each of the recessed areas 132A has a recessed shape as viewed in the z direction, and is recessed to the left side in FIG. 9 relative to the protruding areas 131A. The plurality of protruding areas 131A and the plurality of recessed areas 132A are arranged alternately.

The shapes of the protruding areas 131A and the recessed areas are not particularly limited. It suffices for the protruding areas 131A and the recessed areas 132A to have protruding shapes and recessed shapes, respectively, as viewed in the z direction, and the boundaries between these areas may not be clearly recognized. In the example shown in FIGS. 9 and 10, a surface resulting from averaging the recesses and protrusions of the first surface 121A serves as a reference surface (average surface) 1210A, portions protruding from the reference surface 1210A are regarded as the protruding areas 131A, and portions recessed from the reference surface 1210A are regarded as the recessed areas 132A.

In the illustrated example, each of the protruding areas 131A and each of the recessed areas 132A is provided across the entirety of the first surface 121A in the width direction (z direction). Alternatively, each of the protruding areas 131A and/or each of the recessed areas 132A may be provided on only a portion of the first surface 121A in the z direction. In the illustrated example, the plurality of protruding areas 131A and the plurality of recessed areas 132A are provided across the entirety of the first surface 121A in the y direction, but the plurality of the protruding areas 131A and/or the plurality of recessed areas 132A may instead be provided on only a portion of the first surface 121A in the y direction.

In the illustrated example, the protruding areas 131A and the recessed areas 132A each have an arcuate contour as viewed in the z direction. The radius of curvature R1 of each protruding area 131A and the radius of curvature R2 of each recessed area 132A are set appropriately. For example, the radius of curvature R1 and the radius of curvature R2 may be the same or different. In the illustrated example, the radius of curvature R1 is smaller than the radius of curvature R2.

As shown in FIG. 11, the first surface 121A has a first area 1211A and a second area 1212A. The first area 1211A is a rough surface as compared to the second area 1212A (i.e., the surface roughness is relatively large). The first area 1211A is located closer to the obverse surface 111A than is the second area 1212A, but the present disclosure is not limited to such.

In the illustrated example, the dimension of the first area 1211A in the z direction varies depending on the position in the y direction. More specifically, in the first area 1211A, the maximum dimension Zm1 of a portion included in a protruding area 131A in the z direction is larger than the minimum dimension Zm2 of a portion included in a recessed area 132A in the z direction.

As shown in FIGS. 10 to 13, the reverse surface 112A has a first portion 1121A and a plurality of second portions 1122A. The first portion 1121A includes portions overlapping with the first semiconductor elements 3 as viewed in plan. In the illustrated example, the first portion 1121A is a flat surface perpendicular to the z direction. The second portions 1122A are surrounded by the first surface 121A and a line segment Ls1 that connects the bottoms of adjacent recessed areas 132A as viewed in the z direction. As shown in FIGS. 12 and 13, the second portions 1122A are gently-curved protruding surfaces, for example, that are inclined toward the obverse surface 111A in the z direction with increasing distance from the first portion 1121A in the x direction.

The second area 1212A has a plurality of protrusions 1212Aa, a plurality of recesses 1212Ab, a plurality of protrusions 1212Ac, and a plurality of recesses 1212Ad. The protrusions 1212Aa are portions of the boundary between the second area 1212A and the first area 1211A, and protrude to the first side in the z direction (upward). The recesses 1212Ab are portions of the boundary between the second area 1212A and the first area 1211A, and are recessed to a second side in the z direction (downward). The plurality of protrusions 1212Aa and the plurality of recesses 1212Ab are arranged alternately in the y direction. The protrusions 1212Ac are portions of the boundary between the second area 1212A and the reverse surface 112A, and protrude to the second side in the z direction (downward). The recesses 1212Ad are portions of the boundary between the second area 1212A and the reverse surface 112A, and are recessed to the first side in the z direction (upward). The plurality of protrusions 1212Ac and the plurality of recesses 1212Ad are arranged alternately in the y direction. The protrusions 1212Aa and the protrusions 1212Ac are adjacent to each other in the z direction, and the recesses 1212Ab and the recesses 1212Ad are adjacent to each other in the z direction. The maximum dimension z3 between a protrusion 1212Aa and a protrusion 1212Ac that are adjacent to each other in the z direction is larger than the minimum dimension z4 between a recess 1212Ab and a recess 1212Ad that are adjacent to each other in the z direction.

The first portion 101A has a first protrusion 141A. The first protrusion 141A is located between the obverse surface 111A and the first area 1211A of the first surface 121A, and protrudes from the obverse surface 111A in the z direction. The first protrusion 141A may be formed across the entire length of the boundary between the obverse surface 111A and the first area 1211A (first surface 121A), or may be formed on only a portion of the boundary.

The configuration in which the first surface 121A has the plurality of protruding areas 131A and the plurality of recessed areas 132A may include all or only one of the first area 1211A, the second area 1212A, the plurality of second portions 1122A, and the first protrusion 141A, or may not include any of these. For example, if the lead 1A is formed by punching a metal plate material, an uneven portion that corresponds to the protruding areas 131A and the recessed areas 132A is formed in a punching die. When a portion of the metal plate material that is to be the first portion 101A is punched by the uneven portion of the die moving from the reverse surface 112A to the obverse surface 111A in the z direction, the first area 1211A and the second area 1212A are formed in the plurality of protruding areas 131A and the plurality of recessed areas 132A. The second area 1212A, which is relatively smooth (i.e., the surface roughness is relatively small), corresponds to a portion formed by shearing with the die. The first area 1211A, which is relatively rough, corresponds to a ruptured surface of the plate material. The second portions 1122A of the reverse surface 112A are portions of the reverse surface 112A that are deformed toward the obverse surface 111A in the z direction as a result of punching with the die. The first protrusion 141A is a portion of the plate material elongated in the z direction as a result of rupture of the plate material.

As shown in FIG. 8, the second surface 122A is located opposite from the first surface 121A in the x direction, and faces a second side in the x direction (left side). The second surface 122A is located between the obverse surface 111A and the reverse surface 112A in the z direction. In the illustrated example, the second surface 122A is connected to the obverse surface 111A and the reverse surface 112A. The second surface 122A is smoother than the first surface 121A.

The third surface 123A is located between the first surface 121A and the second surface 122A, and faces a first side in the y direction (upward in FIG. 8). The third surface 123A is located between the obverse surface 111A and the reverse surface 112A in the z direction. In the illustrated example, the third surface 123A is connected to the obverse surface 111A and the reverse surface 112A. The third surface 123A is smoother than the first surface 121A.

The pair of fourth surfaces 124A is located opposite from the third surface 123A in the y direction, and faces a second side in the y direction (downward in FIG. 8). The pair of fourth surfaces 124A are separated from each other in the x direction. The fourth surfaces 124A are located between the obverse surface 111A and the reverse surface 112A in the z direction. In the illustrated example, the fourth surfaces 124A are connected to the obverse surface 111A and the reverse surface 112A.

The pair of fifth surfaces 125A are located between the first surface 121A and the second surface 122A in the x direction, and are located on the second side in the y direction relative to the first surface 121A and the second surface 122A. The pair of fifth surfaces 125A are connected to the first surface 121A and the second surface 122A, respectively. The fifth surfaces 125A are inclined relative to the x direction. The fifth surfaces 125A are located between the obverse surface 111A and the reverse surface 112A in the z direction. In the illustrated example, the fifth surfaces 125A are connected to the obverse surface 111A and the reverse surface 112A.

The pair of sixth surfaces 126A are located between the pair of fifth surfaces 125A in the x direction, and located between the pair of fifth surfaces 125A and the fourth surfaces 124A in the y direction. In the illustrated example, each of the sixth surfaces 126A is connected to one of the pair of fourth surfaces 124A and one of the pair of fifth surfaces 125A. Each of the sixth surfaces 126A faces in the x direction. The sixth surfaces 126A are located between the obverse surface 111A and the reverse surface 112A in the z direction. In the illustrated example, the sixth surfaces 126A are connected to the obverse surface 111A and the reverse surface 112A.

The pair of seventh surfaces 127A are located between the first surface 121A and the third surface 123A in the x direction, and between the second surface 122A and the third surface 123A in the x direction, respectively. Also, each of the seventh surfaces 127A is located between the third surface 123A and either one of the first surface 121A and the second surface 122A in the y direction. The seventh surface 127A on the first side in the x direction (right side in FIG. 8) is connected to the first surface 121A and the third surface 123A. The seventh surface 127A on the second side in the x direction (left side) is connected to the second surface 122A and the third surface 123A. In the illustrated example, the seventh surfaces 127A are protruding curved surfaces as viewed in the z direction. The seventh surfaces 127A are located between the obverse surface 111A and the reverse surface 112A in the z direction. In the illustrated example, the seventh surfaces 127A are connected to the obverse surface 111A and the reverse surface 112A.

In the illustrated example, the fourth surface 124A, the fifth surface 125A, and the sixth surface 126A on the first side in the x direction (where the first surface 121A is located) are formed with a plurality of protruding areas and a plurality of recessed areas. These areas may be similar to the protruding areas 131A and recessed areas 132A of the first surface 121A, for example. The fourth surfaces 124A, the fifth surfaces 125A, and the sixth surfaces 126A may have areas similar to the first area 1211A and second area 1212A of the first surface 121A. Furthermore, the fourth surfaces 124A, the fifth surfaces 125A, and the sixth surfaces 126A may have the first protrusion 141A as described above. The reverse surface 112A may have a plurality of second portions 1122A corresponding to the protruding areas 131A and recessed areas 132A of the fourth surfaces 124A, the fifth surfaces 125A, and the sixth surfaces 126A.

As shown in FIG. 8, the first portion 101A has the plurality of recesses 1111A, the plurality of grooves 1112A, and the plurality of grooves 1113A.

The plurality of recesses 1111A are recessed from the obverse surface 111A in the z direction. The shapes of the recesses 1111A as viewed in the z direction are not particularly limited. In the example shown in FIG. 9, each of the recesses 1111A has a rectangular shape. In the illustrated example, the plurality of recesses 1111A are arranged in a matrix. The plurality of recesses 1111A are arranged at a pitch Px1 in the x direction. The plurality of recesses 1111A are arranged at a pitch Py1 in the y direction. The lengths of the pitch Px1 and the pitch Py1 are set appropriately, and may be the same as or different from each other. In the illustrated example, the pitch Px1 and the pitch Py1 are the same.

An example of the cross-sectional shape of each of the recesses 1111A is shown in FIG. 16. In the illustrated example, the recess 1111A has a first surface 1111Aa and a plurality of second surfaces 1111Ab. The first surface 1111Aa is located at the deepest position in the z direction. For example, the first surface 1111Aa is a flat rectangular surface. The plurality of second surfaces 1111Ab are interposed between the first surface 1111Aa and the obverse surface 111A. The plurality of second surfaces 1111Ab are flat surfaces inclined relative to the z direction. In the illustrated example, a third surface 1111Ac is formed around the recess 1111A. The third surface 1111Ac is raised with respect to the obverse surface 111A in the z direction. The third surface 1111Ac is a portion that surrounds the recess 1111A, and that is raised during the formation of the recess 1111A.

In the example shown in FIG. 8, the grooves 1112A and the grooves 1113A are formed in annular shapes as viewed in the z direction. The recesses 1111A are not formed in the areas located more inward than the grooves 1112A and the grooves 1113A. As viewed in the z direction, the grooves 1113A surround the outsides of the grooves 1112A.

As shown in FIGS. 14 and 15, the grooves 1112A and the grooves 1113A are recessed from the obverse surface 111A in the z direction. In the example shown in FIG. 17, the depth D2 of the groove 1112A is greater than the depth D3 of the groove 1113A.

As shown in FIG. 17, the groove 1112A has a first surface 1112Aa and a pair of second surfaces 1112Ab. The first surface 1112Aa is located at the deepest position in the z direction. For example, the first surface 1112Aa is a flat belt-like surface. The pair of second surfaces 1112Ab are interposed between the first surface 1112Aa and the obverse surface 111A. The pair of second surfaces 1112Ab are flat belt-like surfaces inclined relative to the z direction. In the illustrated example, a third surface 1112Ac is formed around the groove 1112A. The third surface 1112Ac is raised with respect to the obverse surface 111A in the z direction. The third surface 1112Ac is a portion that surrounds the groove 1112A, and that is raised during the formation of the groove 1112A.

The groove 1113A has a pair of second surfaces 1113Ab. The pair of second surfaces 1112Ab are flat belt-like surfaces inclined relative to the z direction. In the illustrated example, a third surface 1113Ac is formed around the groove 1113A. The third surface 1113Ac is raised with respect to the obverse surface 111A in the z direction. The third surface 1113Ac is a portion that surrounds the groove 1113A, and that is raised during the formation of the groove 1113A.

As shown in FIG. 2, the second portion 102A is a portion of the lead 1A that protrudes from the sealing resin 7. The second portion 102A protrudes to the side opposite from the leads 2 with respect to the first portion 101A in the y direction. For example, the second portion 102A is used to electrically connect the semiconductor device A1 to an external circuit. In the illustrated example, the second portion 102A is bent upward in the z direction (see FIG. 1, for example).

As shown in FIG. 3, the third portion 103A and the fourth portion 104A are interposed between the first portion 101A and the second portion 102A. The third portion 103A and the fourth portion 104A are covered with the sealing resin 7. As shown in FIG. 7, the fourth portion 104A is positioned upward in the z direction by a dimension z1 relative to the first portion 101A, and is connected to the second portion 102A. The third portion 103A is connected to the first portion 101A and the fourth portion 104A, and is inclined relative to the y direction. In the illustrated example, the third portion 103A is connected to a portion of the first portion 101A between the pair of the fourth surfaces 124A.

As shown in FIG. 3, the leads 1B, 1C, and 1D are arranged on the second side in the x direction (left side) relative to the lead 1A. The shapes and sizes of the leads 1B to 1D are set appropriately. In the illustrated example, the leads 1B, 1C, and 1D have the same shape and the same size. Accordingly, the following describes the lead 1D.

As shown in FIGS. 3, 6, and 18, the lead 1D has a first portion 101D, a second portion 102D, a third portion 103D, and a fourth portion 104D.

The first portion 101D has an obverse surface 111D, a reverse surface 112D, a first surface 121D, a second surface 122D, a third surface 123D, a fourth surface 124D, a pair of seventh surfaces 127D, an eighth surface 128D, a plurality of recesses 1111D, a plurality of grooves 1112D, and a plurality of grooves 1113D.

The obverse surface 111D faces the first side in the z direction, and is flat as a whole. The reverse surface 112D is a flat surface that faces the side opposite from the obverse surface 111D. The first semiconductor element 3 and the third semiconductor element 5 are mounted on the obverse surface 111D. In the illustrated example, one first semiconductor element 3 and one third semiconductor element are mounted on the obverse surface 111D of the first portion 101D, but the present disclosure is not limited to such. The third semiconductor element 5 may not be mounted on the first portion 101D.

The first surface 121D is located between the obverse surface 111D and the reverse surface 112D in the z direction, and faces the first side in the x direction (right side in FIG. 3). In the illustrated example, the first surface 121D is connected to the obverse surface 111D and the reverse surface 112D.

The second surface 122D is located opposite from the first surface 121D in the x direction. The second surface 122D is located between the obverse surface 111D and the reverse surface 112D in the z direction, and is connected to the obverse surface 111D and the reverse surface 112D.

The third surface 123D is located between the first surface 121D and the second surface 122D in the x direction, and faces the first side in the y direction (upward in FIG. 18). The third surface 123D is located between the obverse surface 111D and the reverse surface 112D in the z direction, and is connected to the obverse surface 111D and the reverse surface 112D.

The fourth surface 124D is located opposite from the third surface 123D in the y direction, and faces the second side in the y direction (downward in FIG. 18). The fourth surface 124D is located between the obverse surface 111D and the reverse surface 112D in the z direction, and is connected to the obverse surface 111D and the reverse surface 112D.

The pair of seventh surfaces 127D are located between the first surface 121D and the third surface 123D, and between the second surface 122D and the third surface 123D in the x direction, respectively, and are located between each of the first and second surfaces 121D, 122D and the third surface 123D. The seventh surface 127D on the first side in the x direction is connected to the first surface 121D and the third surface 123D, and the seventh surface 127D on the second side in the x direction is connected to the second surface 122D and the third surface 123D. The seventh surfaces 127D are protruding curved surfaces as viewed in the z direction. The seventh surfaces 127D are located between the obverse surface 111D and the reverse surface 112D in the z direction, and are connected to the obverse surface 111D and the reverse surface 112D.

The eighth surface 128D is interposed between the second surface 122D and the fourth surface 124D, and is connected to the second surface 122D and the fourth surface 124D. The eighth surface 128D is a protruding curved surface as viewed in the z direction. The eighth surface 128D is located between the obverse surface 111D and the reverse surface 112D in the z direction, and is connected to the obverse surface 111D and the reverse surface 112D.

The first portion 101D is not formed with any areas that correspond to the protruding areas 131A and recessed areas 132A of the first portion 101A.

The first portion 101D has the plurality of recesses 1111D, the plurality of grooves 1112D, and the plurality of grooves 1113D.

The plurality of recesses 1111D are recessed from the obverse surface 111D in the z direction. The shapes of the recesses 1111D as viewed in the z direction are not particularly limited. For example, each of the recesses 1111D may have a rectangular shape similar to the recesses 1111A. The plurality of recesses 1111D may be arranged in a matrix. As with the plurality of recesses 1111A, the plurality of recesses 1111D are arranged at the pitch Px1 in the x direction. The plurality of recesses 1111D are arranged at the pitch Py1 in the y direction.

The cross-sectional shapes of the recesses 1111D are not particularly limited. For example, the recesses 1111D have cross-sectional shapes similar to the recesses 1111A.

The grooves 1112D and the grooves 1113D are formed in annular shapes as viewed in the z direction. The recesses 1111D are not formed in the area located more inward than the grooves 1112D and the grooves 1113D. As viewed in the z direction, the grooves 1113D surround the outsides of the grooves 1112D.

The grooves 1112D and the grooves 1113D are recessed from the obverse surface 111D in the z direction. As with the grooves 1112A and the grooves 1113A, the depth D2 of each groove 1112D is greater than the depth D3 of each groove 1113D.

The grooves 1112D and the grooves 1113D have cross-sectional shapes similar to the grooves 1112A and the grooves 1113A.

The second portion 102D is a portion of the lead 1D that protrudes from the sealing resin 7. The second portion 102D protrudes to the side opposite from the leads 2 with respect to the first portion 101D in the y direction. For example, the second portion 102D is used to electrically connect the semiconductor device A1 to an external circuit. The second portion 102D is bent upward in the z direction.

The third portion 103D and the fourth portion 104D are interposed between the first portion 101D and the second portion 102D. The third portion 103D and the fourth portion 104D are covered with the sealing resin 7. As with the fourth portion 104A, the fourth portion 104D is positioned upward in the z direction by the dimension z1 relative to the first portion 101D, and is connected to the second portion 102D. The third portion 103D is connected to the first portion 101D and the fourth portion 104D, and is inclined relative to the y direction. The third portion 103D is connected to a portion of the first portion 101D near the fourth surface 124D.

As shown in FIGS. 3 and 18, the lead 1E is arranged on the second side in the x direction (left side) relative to the lead 1D. The lead 1E has a second portion 102E and a fourth portion 104E. The lead 1E does not have any portion on which a semiconductor element is mounted.

The second portion 102E is a portion of the lead 1E that protrudes from the sealing resin 7. The second portion 102E protrudes on the side opposite from the leads 2 with respect to the fourth portion 104E in the y direction. For example, the second portion 102E is used to electrically connect the semiconductor device A1 to an external circuit. The second portion 102E is bent upward in the z direction.

The fourth portion 104E is covered with the sealing resin 7, and may have a rectangular shape as viewed in the z direction. As with the fourth portion 104D, the fourth portion 104E is positioned upward in the z direction by the dimension z1 relative to the first portion 101D, and is connected to the second portion 102E.

As shown in FIGS. 3 and 18, the lead 1F is arranged on the second side in the x direction (left side) relative to the lead 1E. The lead 1F has a second portion 102F and a fourth portion 104F. The lead 1F does not have any portion on which a semiconductor element is mounted.

The second portion 102F is a portion of the lead 1F that protrudes from the sealing resin 7. The second portion 102F protrudes on the side opposite from the leads 2 with respect to the fourth portion 104F in the y direction. For example, the second portion 102F is used to electrically connect the semiconductor device A1 to an external circuit. The second portion 102F is bent upward in the z direction.

The fourth portion 104F is covered with the sealing resin 7, and may have a rectangular shape as viewed in the z direction. As with the fourth portion 104E, the fourth portion 104F is positioned upward in the z direction by the dimension z1 relative to the first portion 101D, and is connected to the second portion 102F.

As shown in FIGS. 3 and 18, the lead 1G is arranged on the second side in the x direction (left side) relative to the lead 1F. The lead 1G has a second portion 102G and a fourth portion 104G. The lead 1G does not have any portion on which a semiconductor element is mounted.

The second portion 102G is a portion of the lead 1G that protrudes from the sealing resin 7. The second portion 102G protrudes on the side opposite from the leads 2 with respect to the fourth portion 104G in the y direction. For example, the second portion 102G is used to electrically connect the semiconductor device A1 to an external circuit. The second portion 102G is bent upward in the z direction.

The fourth portion 104G is covered with the sealing resin 7, and may have a rectangular shape as viewed in the z direction. As with the fourth portion 104F, the fourth portion 104G is positioned upward in the z direction by the dimension z1 relative to the first portion 101D, and is connected to the second portion 102G.

As shown in FIG. 3, the lead 1Z is arranged on the first side in the x direction (right side) relative to the lead 1A. The lead 1Z is not electrically connected to the first semiconductor elements 3, the second semiconductor elements 4, or the third semiconductor elements 5. The lead 1Z has a second portion 102Z and a fourth portion 104Z.

The second portion 102Z is a portion of the lead 1Z that protrudes from the sealing resin 7. The second portion 102Z protrudes from the side opposite from the leads 2 with respect to the fourth portion 104Z in the y direction. The second portion 102Z is bent upward in the z direction.

The fourth portion 104Z is covered with the sealing resin 7, and may have a rectangular shape as viewed in the z direction. As with the fourth portion 104A, the fourth portion 104Z is positioned upward in the z direction by the dimension z1 relative to the first portion 101A, and is connected to the second portion 102Z.

As shown in FIG. 3, the leads 2A, 2B, 2C, 2D, 2E, 2F, and 2Z take different forms as appropriate in terms of shape, position, and conductive relationship with semiconductor elements or electronic components. The following describes individual leads 2 while descriptions on common features are omitted as appropriate.

As shown in, for example, FIG. 3, the lead 2A ("second lead") has a plurality of first portions 201A, a plurality of second portions 202A, a plurality of fourth portions 204A, a fifth portion 205A, a sixth portion 206A, a seventh portion 207A, and an eighth portion 208A.

As shown in FIG. 7, each of the first portions 201A has a obverse surface 211A and a reverse surface 212A. The obverse surface 211A is a flat surface that faces the first side in the z direction. The reverse surface 212A is a flat surface that faces the side opposite from the obverse surface 211A in the z direction. The second semiconductor elements 4 are mounted on the obverse surfaces 211A. In the illustrated example, there are two first portions 201A, and one second semiconductor element 4 is mounted on the obverse surface 211A of each of the first portions 201A. However, the present disclosure is not limited to such.

The two first portions 201A are arranged side by side in the x direction. The first portion 201A on the first side in the x direction (right side in FIG. 3) faces the third surface 123A of the first portion 101A of the lead 1A. The first portion 201A on the second side (left side) faces a third surface 123C of the first portion 101C of the lead 1C. The shapes of the first portions 201A are not particularly limited. In the illustrated example, each of the first portions 201A has a rectangular shape as viewed in the z direction, and more specifically, a rectangular shape elongated in the x direction.

As shown in FIG. 7, the first portions 201A are positioned upward in the z direction by a dimension z2 relative to the first portion 101A of the lead 1A. The dimension z2 may be the same as or different from the dimension z1. In the illustrated example, the dimension z1 is the same as the dimension z2.

In the example shown in FIG. 3, there are two second portions 202A, and each of the second portions 202A is a portion of the lead 2A that protrudes from the sealing resin 7. The second portions 202A protrude to the side opposite from the leads 1 with respect to the first portions 201A in the y direction. For example, the second portions 202A are used to electrically connect the semiconductor device A1 to an external circuit. In the illustrated example, the second portions 202A are bent upward in the z direction. Two second portions 202A are arranged apart from each other in the x direction.

In the example shown in FIG. 3, there are two fourth portions 204A, and each of the fourth portions 204A is interposed between one of the first portions 201A (the first portion 201A on the left side in the illustrated example) and a corresponding one of the second portions 202A. The two fourth portions 204A are covered with the sealing resin 7. The positions of the fourth portions 204A in the z direction are the same as those of the first portions 201A. The fourth portion 204A on the right side has a belt-like shape elongated in the y direction. The fourth portion 204A on the left side extends with an inclination relative to the x direction.

The fifth portion 205A is interposed between and connected to the two first portions 201A. In the illustrated example, the fifth portion 205A has a belt-like shape extending in the x direction.

The sixth portion 206A extends from the first portion 201A on the right side to the first side in the x direction. In the illustrated example, the sixth portion 206A has a rectangular shape elongated in the x direction.

The seventh portion 207A has a belt-like shape extending in the y direction from the right end of the sixth portion 206A.

The eighth portion 208A extends in the y direction from the seventh portion 207A and protrudes from the sealing resin 7.

As shown in FIGS. 3 and 19, each of the first portions 201A has a plurality of recesses 2111A. The recesses 2111A are recessed from the obverse surface 211A in the z direction. The shapes of the recesses 2111A as viewed in the z direction are not particularly limited. In the example shown in FIG. 19, each of the recesses 2111A has a rectangular shape. The plurality of recesses 2111A are arranged in a matrix. The plurality of recesses 2111A are arranged at a pitch Px2 in the x direction. The plurality of recesses 2111A are arranged at a pitch Py2 in the y direction. The lengths of the pitch Px2 and the pitch Py2 may be the same as or different from each other. In the illustrated example, the pitch Px2 and the pitch Py2 are the same. The pitch Px2 and the pitch Py2 are greater than the pitch Px1 and the pitch Py1 of the recesses 1111A in FIG. 9. In other words, the plurality of recesses 1111A have an arrangement density (the number per predetermined area) higher than the plurality of recesses 2111A. The cross-sectional shapes of the recesses 2111A are not particularly limited, and may be the same as the cross-sectional shapes of the recesses 1111A in FIG. 16, for example.

As shown in FIG. 3, the lead 2B, the lead 2C, and the lead 2D are arranged in the y direction (upward) relative to a portion of the lead 2A.

The lead 2B has a first portion 201B and a second portion 202B.

One of the electronic components 49 (see FIG. 1) is mounted on the first portion 201B. The shape of the first portion 201B is not particularly limited. The first portion 201B is covered with the sealing resin 7. The position of the first portion 201B in the z direction is the same as the positions of the first portions 201A.

The first portion 201B has a plurality of recesses 2111B and a plurality of grooves 2112B.

The plurality of recesses 2111B are recessed in the z direction. The shapes of the recesses 2111B as viewed in the z direction are not particularly limited. In the illustrated example, each of the recesses 2111B has a rectangular shape similar to the recesses 2111A. The plurality of recesses 2111B are arranged side by side in the y direction. For example, the plurality of recesses 2111B are arranged at the pitch Py2 in the y direction, similarly to the plurality of recesses 2111A. The cross-sectional shapes of the recesses 2111B are not particularly limited. In the illustrated example, the recesses 2111B have cross-sectional shapes similar to the recesses 2111A.

In the illustrated example, the grooves 2112B are formed to partition the electronic component 49 from the plurality of recesses 2111B as viewed in the z direction. The grooves 2112B are recessed in the z direction. In the illustrated example, the grooves 2112B have cross-sectional shapes similar to the grooves 1112A.

The second portion 202B is a portion of the lead 2B that protrudes from the sealing resin 7. The second portion 202B protrudes to the side opposite from the leads 1 with respect to the first portion 201B in the y direction. For example, the second portion 202B is used to electrically connect the semiconductor device A1 to an external circuit. The second portion 202B is bent upward in the z direction. The first portion 201B and the second portion 202B are connected to each other.

The lead 2C has a first portion 201C and a second portion 202C.

One of the electronic components 49 is mounted on the first portion 201C. The shape of the first portion 201C is not particularly limited. The first portion 201C is covered with the sealing resin 7. The position of the first portion 201C in the z direction is the same as the positions of the first portions 201A.

The first portion 201C has a plurality of recesses 2111C and a plurality of grooves 2112C.

The plurality of recesses 2111C are recessed in the z direction. The shapes of the recesses 2111C as viewed in the z direction are not particularly limited. In the illustrated example, each of the recesses 2111C has a rectangular shape similar to the recesses 2111A. Also, in the illustrated example, the plurality of recesses 2111C are arranged side by side in the x direction. As with the plurality of recesses 2111A, the plurality of recesses 2111C may be arranged at the pitch Px2 in the x direction. The cross-sectional shapes of the recesses 2111C are not particularly limited. In the illustrated example, the recesses 2111C have cross-sectional shapes similar to the recesses 2111A.

The grooves 2112C are formed to partition the electronic component 49 from the plurality of recesses 2111C as viewed in the z direction. The grooves 2112C are recessed in the z direction. In the illustrated example, the grooves 2112C have cross-sectional shapes similar to the grooves 1112A.

The second portion 202C is a portion of the lead 2C that protrudes from the sealing resin 7. The second portion 202C protrudes to the side opposite from the leads 1 with respect to the first portion 201C in the y direction. For example, the second portion 202C is used to electrically connect the semiconductor device A1 to an external circuit. The second portion 202C is bent upward in the z direction. The first portion 201C and the second portion 202C are connected to each other.

The lead 2D has a first portion 201D and a second portion 202D.

One of the electronic components 49 is mounted on the first portion 201D. The shape of the first portion 201D is not particularly limited. The first portion 201D is covered with the sealing resin 7. The position of the first portion 201D in the z direction is the same as the positions of the first portions 201A.

The first portion 201D has a plurality of recesses 2111D and a plurality of grooves 2112D.

The plurality of recesses 2111D are recessed in the z direction. The shapes of the recesses 2111D as viewed in the z direction are not particularly limited. In the illustrated example, each of the recesses 2111D has a rectangular shape similar to the recesses 2111A. The plurality of recesses 2111D are arranged side by side in the X direction. As with the plurality of recesses 2111A, the plurality of recesses 2111D may be arranged at the pitch Px2 in the x direction. The cross-sectional shapes of the recesses 2111D are not particularly limited. The recesses 2111D have cross-sectional shapes similar to the recesses 2111A.

The grooves 2112D are formed to partition the electronic component 49 from the plurality of recesses 2111D as viewed in the z direction. The grooves 2112D are recessed in the z direction. The grooves 2112D have cross-sectional shapes similar to the grooves 1112A.

The second portion 202D is a portion of the lead 2D that protrudes from the sealing resin 7. The second portion 202D protrudes to the side opposite from the leads 1 with respect to the first portion 201D in the y direction. For example, the second portion 202D is used to electrically connect the semiconductor device A1 to an external circuit. The second portion 202D is bent upward in the z direction. The first portion 201D and the second portion 202D are connected to each other.

As shown in FIG. 3, the plurality of leads 2E are arranged on the left side in the x direction relative to the lead 2D.

Each of the leads 2E has a first portion 201E, a second portion 202E, and a fourth portion 204E.

The first portion 201E is a portion to which a wire 93 is bonded. The shape of the first portion 201E is not particularly limited. In the illustrated example, the first portion 201E has a rectangular shape. The first portion 201E is covered with the sealing resin 7. The position of the first portion 201E in the z direction is the same as the positions of the first portions 201A.

The second portion 202E is a portion of the lead 2E that protrudes from the sealing resin 7. The second portion 202E protrudes on the side opposite from the leads 1 with respect to the first portion 201E in the y direction. For example, the second portion 202E is used to electrically connect the semiconductor device A1 to an external circuit. The second portion 202E is bent upward in the z direction.

The fourth portion 204E is interposed between the first portion 201E and the second portion 202E. The fourth portion 204E is covered with the sealing resin 7. The position of the fourth portion 204E in the z direction is the same as the first portion 201E. The fourth portion 204E is connected to the first portion 201E and the second portion 202E. The fourth portion 204E is L-shaped.

The second portions 202E of the plurality of leads 2E are arranged between the second portion 202D of the lead 2D and one of the second portions 202A of the lead 2A in the x direction.

As shown in FIG. 3, the plurality of leads 2F are arranged on the left side in the x direction relative to the plurality of leads 2E.

Each of the leads 2F has a first portion 201F, a second portion 202F, and a fourth portion 204F.

The first portion 201F is a portion to which a wire 93 is bonded. The shape of the first portion 201F is not particularly limited. In the illustrated example, the first portion 201F has a quadrangular shape. The first portion 201F is arranged side by side with the other first portions 201F of the plurality of leads 2F in the x direction. The first portion 201F is covered with the sealing resin 7. The position of the first portion 201F in the z direction is the same as the positions of the first portions 201A.

The second portion 202F is a portion of the lead 2F that protrudes from the sealing resin 7. The second portion 202F protrudes on the side opposite from the leads 1 with respect to the first portion 201F in the y direction. For example, the second portion 202F is used to electrically connect the semiconductor device A1 to an external circuit. The second portion 202F is bent upward in the z direction.

The fourth portion 204F is interposed between the first portion 201F and the second portion 202F. The fourth portion 204F is covered with the sealing resin 7. The position of the fourth portion 204F in the z direction is the same as the positions of the first portions 201A. The fourth portion 204F is interposed between the first portion 201F and the second portion 202F. The fourth portion 204F has an elongated shape inclined relative to the y direction.

In the illustrated example, the second portions 202F of the plurality of leads 2F are arranged between the two second portions 202A of the lead 2A in the x direction.

As shown in FIG. 3, the lead 2Z is arranged on the second side in the x direction relative to the lead 2A. The lead 2Z is not electrically connected to the first semiconductor elements 3, the second semiconductor elements 4, or the third semiconductor elements 5. The lead 2Z has a first portion 201Z, a second portion 202Z, and a fourth portion 204Z.

The first portion 201Z is arranged on the left side of one of the first portions 201A of the lead 2A in the x direction. The position of the first portion 201Z in the z direction is the same as the positions of the first portions 201A. The first portion 201Z is covered with the sealing resin 7.

The second portion 202Z is a portion of the lead 2Z that protrudes from the sealing resin 7. The second portion 202Z protrudes on the side opposite from the leads 1 with respect to the first portion 201Z in the y direction. The second portion 202Z is bent upward in the z direction.

The fourth portion 204Z is covered with the sealing resin 7 and interposed between the first portion 201Z and the second portion 202Z. The fourth portion 204Z is L-shaped as viewed in the z direction. The fourth portion 204Z has a plurality of recesses 21112.

The plurality of recesses 21112 are recessed in the z direction. The shapes of the recesses 21112 as viewed in the z direction are not particularly limited. In the illustrated example, each of the recesses 21112 has a rectangular shape similar to the recesses 2111A. The plurality of recesses 21112 are arranged in a matrix. As with the plurality of recesses 2111A, the plurality of recesses 21112 may be arranged at the pitch Px2 in the x direction. The plurality of recesses 21112 are arranged at the pitch Py2 in the y direction, similarly to the plurality of recesses 2111A. The cross-sectional shapes of the recesses 21112 are not particularly limited. In the illustrated example, the recesses 21112 have cross-sectional shapes similar to the recesses 2111A.

As shown in FIG. 3, the second portion 202B, the second portion 202C, and the second portion 202D are arranged side by side at a pitch x1 in the x direction. The plurality of second portions 202E, the plurality of second portions 202F, the two second portions 202A, and the second portion 202Z are arranged side by side at a pitch x2 in the x direction. The pitch x1 is greater than the pitch x2. The distance between the second portion 202D and the adjacent second portion 202E is x1.

The first semiconductor elements 3 are functional elements for the semiconductor device A1 to function as an IPM. The first semiconductor elements 3 are power semiconductor elements. For example, a three-phase alternate current, which is a control target in the IPM, flows in and out of the first semiconductor elements 3. Each of the first semiconductor elements 3 is typically an insulated-gate bipolar transistor (IGBT), a bipolar transistor, a metal-oxide-semiconductor field-effect transistor (MOSFET), or the like. The first semiconductor elements 3 are mounted on the obverse surface 111A of the first portion 101A of the lead 1A, the obverse surface 111B of the first portion 101B of the lead 1B, the obverse surface 111C of the first portion 101C of the lead 1C, and the obverse surface 111D of the first portion 101D of the lead 1D.

The first semiconductor elements 3 have first electrodes 31, second electrodes 32, and third electrodes 33. The first electrodes 31 are arranged to face the obverse surfaces 111A, 111B, 111C, and 111D (see FIG. 6). The second electrodes 32 and the third electrodes 33 are provided opposite from the first electrodes 31 in the z direction (see FIG. 3).

When the first semiconductor elements 3 are IGBTs, the first electrodes 31 are collector electrodes, the second electrodes 32 are emitter electrodes, and the third electrodes 33 are gate electrodes. When the first semiconductor elements 3 are bipolar transistors, the first electrodes 31 are collector electrodes, the second electrodes 32 are emitter electrodes, and the third electrodes 33 are base electrodes. When the first semiconductor elements 3 are MOSFETs, the first electrodes 31 are drain electrodes, the second electrodes 32 are source electrodes, and the third electrodes 33 are gate electrodes.

As shown in FIGS. 3 and 6, three first semiconductor elements 3 are mounted on the obverse surface 111A of the first portion 101A of the lead 1A. The arrangement of the three first semiconductor elements 3 is not particularly limited. In the illustrated example, the three first semiconductor elements 3 are arranged side by side at an equal interval in the x direction. The first semiconductor elements 3 are mounted on the first portion 101A by bonding the first electrodes 31 and the obverse surface 111A with bonding layers 39. The bonding layers 39 are made of conductive bonding materials containing Ag, for example.

One first semiconductor element 3 is mounted on each of the obverse surfaces 111B, 111C, and 111D. The first electrodes 31 of the first semiconductor elements 3 are bonded to the obverse surfaces 111B, 111C, and 111D with bonding layers 39, for example. Six first semiconductor elements 3 on the first portions 101A, 101B, 101C, and 101D are arranged side by side in the x direction, and their positions in the y direction are the same.

The third semiconductor elements 5 are elements that assist the functions of the first semiconductor elements 3, for example, and may be fast recovery diodes (FRDs) for rectifying a three-phase alternate current that is a control target in the IPM. In the illustrated example, three third semiconductor elements 5 are mounted on the obverse surface 111A of the first portion 101A. One third semiconductor element 5 is mounted on each of the obverse surfaces 111B, 111C, and 111D. The third semiconductor elements 5 are arranged on the second side in the y direction relative to the respective first semiconductor elements 3 and aligned with them in the y direction.

The third semiconductor elements 5 have first electrodes and second electrodes 52. The first electrodes 51 are arranged to face the obverse surfaces 111A, 111B, 111C, and 111D. As shown in FIG. 7, the first electrodes 51 are bonded to the obverse surfaces 111A, 111B, 111C, and 111D by bonding layers 59. The bonding layers 59 are made of conductive bonding materials containing Ag, for example.

The second semiconductor elements 4 are control semiconductor elements for controlling the operations of the first semiconductor elements 3, and may be driver ICs. As shown in FIGS. 3 and 7, two second semiconductor elements 4 are respectively mounted on the two first portions 201A of the lead 2A. The second semiconductor elements 4 are bonded to the obverse surfaces 211A of the first portions 201A by bonding layers 45. For example, the bonding layers 45 are made of conductive bonding materials or insulating bonding materials.

Each of the second semiconductor elements 4 has a plurality of first electrodes 41 and a plurality of second electrodes 42. The plurality of first electrodes 41 are arranged on the side of the leads 1 (on the side of the first semiconductor elements 3) in the y direction. The plurality of second electrodes 42 are provided on the first side in the z direction or on the second side in the x direction relative to the plurality of first electrodes 41.

The electronic components 49 are elements that assist the functions of the second semiconductor elements 4, and may be diodes, for example. As shown in FIGS. 3 and 7, the electronic components 49 are mounted one each on the first portion 201B of the lead 2B, the first portion 201C of the lead 2C, and the first portion 201D of the lead 2D. The electronic components 49 are bonded to the first portions 201B, 201C, and 201D by bonding layers 491. The bonding layers 491 are made of conductive bonding materials containing Ag, for example.

The wires 91, 92, and 93 are for electrically connecting the plurality of leads 1, the plurality of leads 2, the first semiconductor elements 3, the second semiconductor elements 4, and the third semiconductor elements 5 in a predetermined relationship in an appropriate manner. The material and size of each of the wires 91, 92, and 93 are not particularly limited. In the present embodiment, the wires 91 may be made of Al, and the wires 92 and 93 may be made of Au, for example. The wires 91 have a larger diameter than the wires 92 and 93. The wires 91 may be made of another metal such as Au or Cu. Likewise, the wires 92 and 93 may be made of a metal other than Au.

As shown in FIG. 3, the semiconductor device A1 includes six wires 91. The wires 91 are connected to the second electrodes 32 of the first semiconductor elements 3 and the second electrodes 52 of the third semiconductor elements 5. Also, as viewed from the first side (right side) to the other in the x direction, the wires 91 are connected to the respective second electrodes 52 of the corresponding third semiconductor elements 5 and further to the fourth portion 104B, the fourth portion 104C, the fourth portion 104D, the fourth portion 104E, the fourth portion 104F, and the fourth portion 104G, respectively.

The plurality of wires 92 are connected to the second electrodes 32 and the third electrodes 33 of the first semiconductor elements 3, and to the first electrodes 41 of the second semiconductor elements 4. The second electrodes 32 and the third electrodes 33 of the three first semiconductor elements 3 mounted on the first portion 101A are connected to the plurality of first electrodes 41 of the second semiconductor element 4 on the first side in the x direction (right side) by the plurality of wires 92. The third electrodes 33 of the three first semiconductor elements 3 respectively mounted on the first portions 101B, 101C, and 101D are connected to the plurality of first electrodes 41 of the second semiconductor element 4 on the second side in the x direction (left side) by the plurality of wires 92.

The second electrodes 42 of the second semiconductor element 4 on the first side in the x direction (right side) are connected to the plurality of electronic components 49, the first portions 201B, 201C, 201D, and 201E, and the fifth portion 205A by the plurality of wires 93. Each of the portions of the first portions 201B, 201C, 201D, and 201E and the fifth portion 205A to which the wires 93 are bonded may be provided with a plating layer made of Ag, for example.

The second electrodes 42 of the second semiconductor element 4 on the second side in the x direction (left side) are connected to the first portions 201F and the fourth portions 204A by the plurality of wires 93. Each of the portions of the first portions 201F and the fourth portions 204A to which the wires 93 are bonded may be provided with a plating layer made of Ag, for example.

As shown in FIG. 8, at the first portion 101A, the plurality of grooves 1112A on the first side in the y direction surround three areas 1115A. In the illustrated example, each of the areas 1115A has a rectangular shape, and one first semiconductor element 3 is arranged in each of the areas 1115A. The plurality of grooves 1112A surrounding the three areas 1115A are surrounded by the plurality of grooves 1113A. Also, at the first portion 101A, the plurality of grooves 1112A on the second side in the y direction surround three areas 1116A. Each of the areas 1116A has a rectangular shape, and one third semiconductor element 5 is arranged in each of the areas 1116A. The plurality of grooves 1112A surrounding the areas 1116A are surrounded by the plurality of grooves 1113A.

As shown in FIG. 8, the number of arrays of recesses 1111A in the y direction is selected appropriately depending on the location. For example, the number of arrays M1 between the fourth surfaces 124A and the areas 1116A (third semiconductor elements 5) is seven. The number of arrays M2 between the area 1116A (a third semiconductor element 5) and the area 1115A (the corresponding first semiconductor element 3) is two. The number of arrays M3 between the area 1116A (another third semiconductor element 5) and the area 1115A (the corresponding first semiconductor element 3) is two. The number of arrays M4 between the areas 1115A (first semiconductor elements 3) and the third surface 123A is one. Thus, in the illustrated example, M1>M2=M3>M4. The number of arrays of recesses 1111A in the x direction is also selected appropriately depending on the location. For example, the number of arrays N1 between the first surface 121A and the area 1116A (third semiconductor element 5), the number of arrays N2 between the adjacent areas 1116A (third semiconductor elements 5), and the number of arrays N3 between the second surface 122A and the area 1116A (third semiconductor element 5) are the same, i.e., N1=N2=N3=3. On the other hand, the number of arrays N4 between the first surface 121A and the area 1115A (first semiconductor element 3), and the number of arrays N5 between the second surface 122A and the area 1115A (first semiconductor element 3) is one. In other words, in the illustrated example, N1=N2=N3>N4=N5.

The supporting member 6 supports the leads 1A, 1B, 1C, and 1D, and transfers heat via these leads from the first semiconductor elements 3 and the third semiconductor elements 5 to the outside of the semiconductor device A1, for example. The supporting member 6 is made of ceramics and has a rectangular plate-like shape. It is preferable that the supporting member be made of ceramics in terms of strength, heat transfer coefficient, and insulation. However, the material of the supporting member 6 is not limited to this, and various other materials may be employed to form the supporting member 6. The supporting member 6 having a plate-like shape is preferable for thinning the semiconductor device A1, but the supporting member 6 may have various other shapes.

As shown in FIGS. 3, 6, and 7, the supporting member 6 has a supporting member obverse surface 61, a supporting member reverse surface 62, a supporting member first surface 63, a supporting member second surface 64, a supporting member third surface 65, and a supporting member fourth surface 66.

The supporting member obverse surface 61 faces the first side in the z direction, and also faces the leads 1A, 1B, 1C, and 1D. The supporting member reverse surface 62 faces the side opposite from the supporting member obverse surface 61. The supporting member reverse surface 62 is exposed from the sealing resin 7.

The supporting member first surface 63 is located between the supporting member obverse surface 61 and the supporting member reverse surface 62 in the z direction, and faces the first side in the x direction. The supporting member first surface 63 is connected to the supporting member obverse surface 61 and the supporting member reverse surface 62.

The supporting member second surface 64 is located between the supporting member obverse surface 61 and the supporting member reverse surface 62 in the z direction, and faces the second side in the x direction. The supporting member second surface 64 is connected to the supporting member obverse surface 61 and the supporting member reverse surface 62.

The supporting member third surface 65 is located between the supporting member obverse surface 61 and the supporting member reverse surface 62 in the z direction, and faces the first side in the y direction. The supporting member third surface 65 is connected to the supporting member obverse surface 61 and the supporting member reverse surface 62.

The supporting member fourth surface 66 is located between the supporting member obverse surface 61 and the supporting member reverse surface 62 in the z direction, and faces the side opposite from the supporting member third surface 65 in the y direction. The supporting member fourth surface 66 is connected to the supporting member obverse surface 61 and the supporting member reverse surface 62.

The reverse surfaces 112A, 112B, 112C, and 112D of the leads 1A, 1B, 1C, and 1D are bonded to the supporting member obverse surface 61 of the supporting member 6 via bonding layers 69. It is preferable that the bonding layers 69 appropriately bond the supporting member 6 made of, e.g., ceramics to the leads 1A, 1B, 1C, and 1D made of, e.g., Cu, and have relatively good heat conductivity. For example, the bonding layers 69 may be a resin adhesive with excellent heat conductivity.

The sealing resin 7 partially or entirely covers the plurality of leads 1, the plurality of leads 2, the plurality of first semiconductor elements 3, the plurality of second semiconductor elements 4, the plurality of third semiconductor elements 5, the plurality of electronic components 49, the plurality of wires 91, 92, and 93, and the supporting member 6. The sealing resin 7 is a black epoxy resin, for example.

As shown in FIGS. 3 to 7, the sealing resin 7 has a resin obverse surface 71, a resin reverse surface 72, a resin first surface 73, a resin second surface 74, a resin third surface 75, and a resin fourth surface 76.

The resin obverse surface 71 faces outwards to the first side in the z direction, while also facing inwards to the leads 1A, 1B, 1C, and 1D. The resin reverse surface 72 faces the side opposite from the resin obverse surface 71 in the z direction.

The resin first surface 73 is located between the resin obverse surface 71 and the resin reverse surface 72 in the z direction, and faces the first side in the x direction. The resin first surface 73 is connected to the resin obverse surface 71 and the resin reverse surface 72.

The resin second surface 74 is located between the resin obverse surface 71 and the resin reverse surface 72 in the z direction, and faces the second side in the x direction. The resin second surface 74 is connected to the resin obverse surface 71 and the resin reverse surface 72.

The resin third surface 75 is located between the resin obverse surface 71 and the resin reverse surface 72 in the z direction, and faces the first side in the y direction. The resin third surface 75 is connected to the resin obverse surface 71 and the resin reverse surface 72.

The resin fourth surface 76 is located between the resin obverse surface 71 and the resin reverse surface 72 in the z direction, and faces the side opposite from the resin third surface 75 in the y direction. The resin fourth surface 76 is connected to the resin obverse surface 71 and the resin reverse surface 72.

The sealing resin 7 has a recess 710, a recess 720, and a plurality of recesses 730.

As shown in FIGS. 3 and 8, the recess 710 is recessed from the resin first surface 73 in the x direction, and is used to fix the semiconductor device A1 when it is mounted. The shape of the recess 710 is not particularly limited. In the illustrated example, the recess 710 has a first surface 711 and a pair of second surfaces 712. The first surface 711 forms the bottom surface of the recess 710, and is a recessed curved surface, for example. The pair of second surfaces 712 connect to the respective ends of the first surface 711 and to the resin first surface 73. For example, the pair of second surfaces 712 are surfaces along the x direction. The position of the recess 710 in the y direction coincides with a portion of the first portion 101A. In other words, the recess 710 overlaps with the first portion 101A as viewed in the x direction.

FIG. 8 shows a pair of first virtual lines L1. The pair of first virtual lines L1 extend along the x direction from the respective ends of the first surface 121A in the y direction to the resin first surface 73. As viewed in the z direction, an area surrounded by the first surface 121A, the resin first surface 73, the recess 710, and the pair of first virtual lines L1 is referred to as a first area S1.

FIG. 8 shows a pair of second virtual lines L2. The pair of second virtual lines L2 extend along the x direction from the respective ends of the recess 710 in the y direction (the pair of second surfaces 712 in the illustrated example) to the first surface 121A. As viewed in the z direction, an area surrounded by the first surface 121A, the recess 710, and the pair of second virtual lines L2 is referred to as a second area S2. The second area S2 is included in the first area S1 as a part of the first area S1.

The plurality of leads 1 are arranged in an area avoiding the first area S1 as viewed in the z direction. In other words, none of the plurality of leads 1 is arranged in the first area S1 as viewed in the z direction. The first surface 121A of the lead 1A is adjacent to the first area S1. In other words, the plurality of protruding areas 131A and the plurality of recessed areas 132A are adjacent to the first area S1.

The plurality of leads 1 are arranged in an area avoiding the second area S2 as viewed in the z direction. In other words, none of the plurality of leads 1 is arranged in the second area S2 as viewed in the z direction. The first surface 121A of the lead 1A is adjacent to the second area S2. In other words, the plurality of protruding areas 131A and the plurality of recessed areas 132A are adjacent to the first area S1.

The supporting member first surface 63 of the supporting member 6 is located between the first surface 121A and the resin first surface 73 as viewed in the z direction (in the x direction). The supporting member first surface 63 intersects with the first area S1 as viewed in the z direction. The supporting member first surface 63 is located between the first surface 121A and the recess 710 (first surface 711) as viewed in the z direction (in the x direction). The supporting member first surface 63 intersects with the second area S2 as viewed in the z direction.

As shown in FIGS. 3 and 18, the recess 720 is recessed from the resin second surface 74 in the x direction, and is used to fix the semiconductor device A1 when it is mounted. The shape of the recess 720 is not particularly limited. In the illustrated example, the recess 720 has a first surface 721 and a pair of second surfaces 722. The first surface 721 forms the bottom surface of the recess 720, and is a recessed curved surface, for example. The pair of second surfaces 722 are connected to the respective ends of the first surface 721 and to the resin second surface 74. For example, the pair of second surfaces 722 are surfaces along the x direction. The position of the recess 720 in the y direction coincides with a portion of the first portion 101D. In other words, the recess 720 overlaps with the first portion 101D as viewed in the x direction.

FIG. 18 shows a pair of third virtual lines L3. The pair of third virtual lines L3 extend along the x direction from the respective ends of the second surface 122D in the y direction to the resin second surface 74. As viewed in the z direction, an area surrounded by the second surface 122D, the resin second surface 74, the recess 720, and the pair of third virtual lines L3 is referred to as a third area S3.

FIG. 18 shows a pair of fourth virtual lines L4. The pair of fourth virtual lines L4 extend along the x direction from the respective ends of the recess 720 in the y direction (the pair of second surfaces 722 in the illustrated example) to the second surface 122D. As viewed in the z direction, an area surrounded by the second surface 122D, the recess 720, and the pair of fourth virtual lines L4 is referred to as a fourth area S4. The fourth area S4 is included in the third area S3 as a part of the third area S3.

A portion of the fourth portion 104G of the lead 1G among the plurality of leads 1 is arranged within the third area S3 as viewed in the z direction. In other words, the plurality of leads 1 other than the lead 1G are arranged in an area avoiding the third area S3 as viewed in the z direction. The second surface 122D of the lead 1D is adjacent to the third area S3.

The plurality of leads 1 are arranged in an area avoiding the fourth area S4 as viewed in the z direction. In other words, none of the plurality of leads 1 is arranged in the fourth area S4 as viewed in the z direction. The second surface 122D of the lead 1D is adjacent to the fourth area S4.

The supporting member second surface 64 of the supporting member 6 is located between the second surface 122D and the resin second surface 74 as viewed in the z direction (in the x direction). The supporting member second surface 64 intersects with the third area S3 as viewed in the z direction. The supporting member second surface 64 is located between the second surface 122D and the recess 720 (first surface 721) as viewed in the z direction (in the x direction). The supporting member second surface 64 intersects with the fourth area S4 as viewed in the z direction.

First Embodiment; Mounting Structure B1

Figure 20:
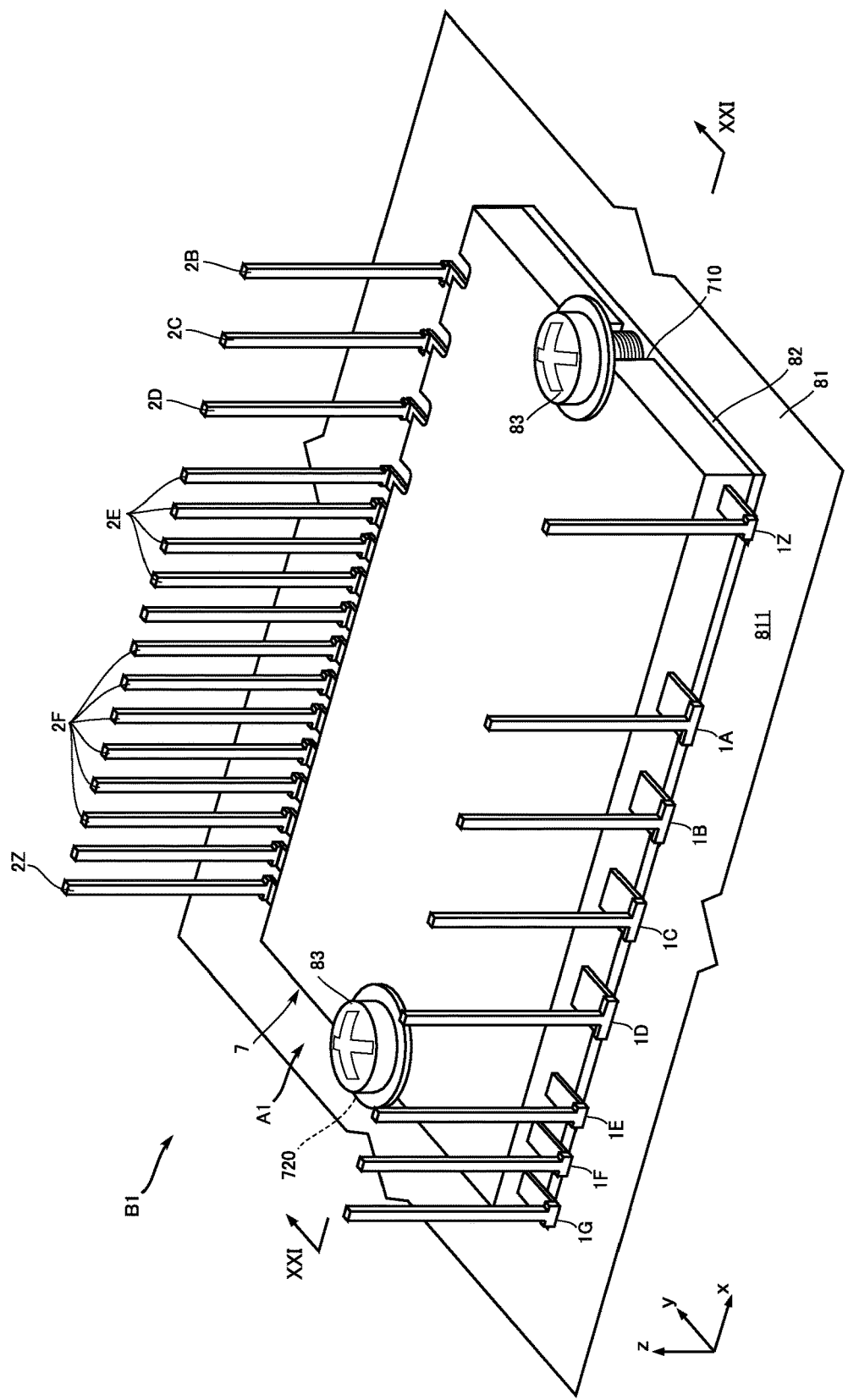
FIG. 20 is a perspective view for describing a mounting structure according to the first embodiment.
Figure 21:
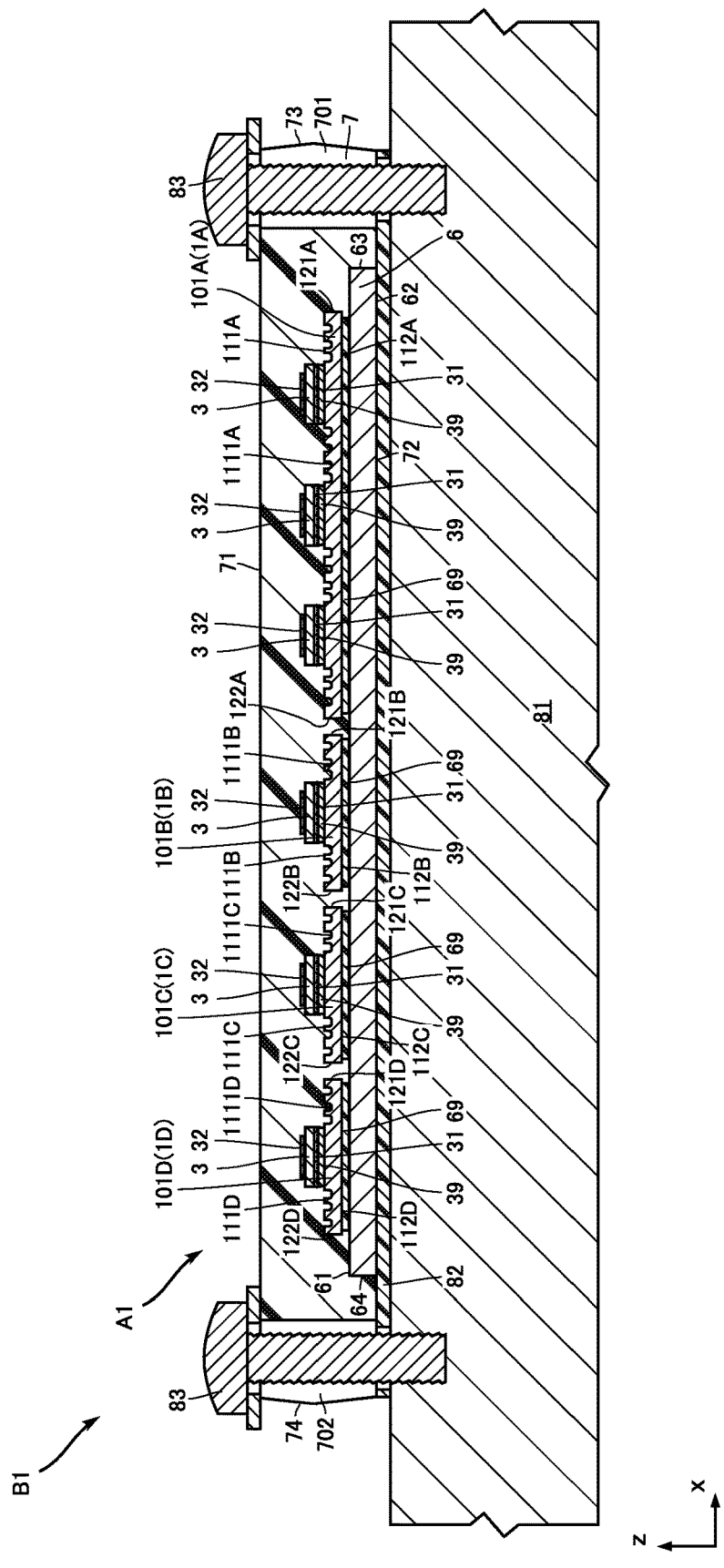
FIG. 21 is a cross-sectional view along line XXI-XXI in FIG. 20.

FIGS. 20 and 21 show a mounting structure B1 according to a first embodiment of the present disclosure. The mounting structure B1 is one form of the mounting structure of the semiconductor device A1, and is mounted on a mount member 81. The mounting structure B1 includes a semiconductor device A1, a mount member 81, an interposing member 82, and fixing members 83.

The mount member 81 is a member on which the semiconductor device A1 is mounted. The material and shape of the mount member 81 are not particularly limited. In the illustrated example, the mount member 81 is shaped to have a flat obverse surface 811 facing the first side in the z direction. The material of the mount member 81 is a metal with excellent heat conductivity, such as A1.

The interposing member 82 is provided between the semiconductor device A1 and the mount member 81. In the illustrated example, the interposing member 82 is interposed between the obverse surface 811 of the mount member 81 and each of the supporting member reverse surface 62 and the resin reverse surface 72 of the semiconductor device A1. The interposing member 82 fills the gap between the obverse surface 811 and the supporting member reverse surface 62. The interposing member 82 is preferably made of an insulating material, and may be a sheet-like material that is made of an insulating resin with excellent heat conductivity, for example. The interposing member 82 has a size and a shape that roughly coincide with the semiconductor device A1 (sealing resin 7) as viewed in the z direction.

The fixing members 83 fix the semiconductor device A1 to the mount member 81 with the interposing member 82 interposed therebetween. The specific structure of each of the fixing members 83 is not particularly limited. In the illustrated example, the fixing members 83 are bolts. More specifically, the fixing members 83 are screwed into female screws provided in the mount member 81, so that the semiconductor device A1 is fastened to the mount member 81 via the interposing member 82. As viewed in the z direction, portions of the fixing members 83 are received by the recess 710 and the recess 720. The fastening force of the fixing members 83 is applied to the resin obverse surface 71 of the sealing resin 7.

Next, advantages of the semiconductor device A1 and the mounting structure B1 will be described.

According to the present embodiment, the first surface 121A is provided with the plurality of protruding areas 131A and the plurality of recessed areas 132A. The first surface 121A is rougher than the third surface 123A, for example, thus allowing for increasing the bonding strength between the first surface 121A and the sealing resin 7. Accordingly, the semiconductor device A1 can suppress cracks in the sealing resin 7 and improve the reliability of the sealing resin 7.

As shown in FIG. 8, the first surface 121A is the surface closest to the resin first surface 73 of the sealing resin 7. None of the plurality of leads 1 is arranged in the first area S1 between the resin first surface 73 and the first surface 121A. Accordingly, if a crack forms in the first surface 121A, it may reach the resin first surface 73 and be exposed to the outside. According to the present embodiment, the plurality of protruding areas 131A and the plurality of recessed areas 132A are provided to suppress cracks that may reach the resin first surface 73.

As shown in FIG. 8, the sealing resin 7 is provided with the recess 710. The second area S2 adjacent to the recess 710 is an area where the dimension in the x direction from the first surface 121A to the outside is reduced. The plurality of protruding areas 131A and the plurality of recessed areas 132A are adjacent to the second area S2 as described above. This makes it possible to suppress cracks in the second area S2.

As shown in FIGS. 20 and 21, one of the fixing members 83 is fastened to the mount member 81 by utilizing the recess 710 of the sealing resin 7 in the mounting structure B1. The fastening force is applied to the second area S2 of the sealing resin 7. The stress resulting from this may cause a crack in the sealing resin 7, beginning from the portion of the first surface 121A adjacent to the first area S1 and the second area S2. According to the present embodiment, the plurality of protruding areas 131A and the plurality of recessed areas 132A can suppress the formation of cracks in sealing resin 7 due to the fastening force of the fixing member 83.

In the mounting structure B1, the interposing member 82 is interposed between the supporting member 6 and the mount member 81. As the hardness of the sheet-like material of the interposing member 82 increases, a crack is more likely to form in the sealing resin 7 within the first area S1 and the second area S2 due to the fastening force of the fixing members 83. The present embodiment can suppress the formation of such a crack.

Referring back to FIG. 9, when the radius of curvature R1 of each protruding area 131A and the radius of curvature R2 of each recessed area 132A are different from each other, a continuous progression of a crack across the plurality of protruding areas 131A and the plurality of recessed areas 132A can be suppressed. It is advantageous in suppressing the progression of a crack when the radius of curvature R1 is smaller than the radius of curvature R2.

As shown in FIGS. 11 to 13, the first surface 121A has the first area 1211A and the second area 1212A. The first area 1211A is rougher than the second area 1212A, and this contributes to the suppression of the formation of cracks. In addition, the surface roughness attributed to the plurality of protruding areas 131A and the plurality of recessed areas 132A (the surface roughness being larger than that of the first area 1211A) can more reliably suppress the formation of cracks.

With the maximum dimension Zm1 being larger than the minimum dimension Zm2, the boundary between the first area 1211A and the second area 1212A forms a roughly wavy line corresponding to the arrangement of the plurality of protruding areas 131A and the plurality of recessed areas 132A. This is preferable for suppressing the progression of a crack along the first surface 121A.

The second portions 1122A of the reverse surface 112A are surfaces curved in the first side in the z direction (toward the obverse surface 111A). A plurality of such second portions 1122A arranged in the y direction can suppress the formation of cracks.

The first protrusion 141A protrudes in the z direction relative to the obverse surface 111A. This makes it possible to further increase the bonding strength between the first portion 101A and the sealing resin 7, and is thus preferable for suppressing the formation of cracks in the sealing resin 7.

The third surface 123A is not provided with the plurality of protruding areas 131A and the plurality of recessed areas 132A, and is smoother than the first surface 121A. The third surface 123A faces the lead 2A. The lead 1A and the lead 2A have a difference in the voltage applied thereto, and the potential difference therebetween tends to be large. It is preferable that the third surface 123A as described above be smooth in order to more reliably insulate the lead 1A and the lead 2A from each other.

As shown in FIGS. 3, 8, and 9, the obverse surface 111A of the first portion 101A is formed with the plurality of recesses 1111A. This increases the bonding strength between the obverse surface 111A and the sealing resin 7.

As shown in FIGS. 9 and 19, the plurality of recesses 1111A have a higher arrangement density than the plurality of recesses 2111A. The first semiconductor elements 3 on the lead 1A generate more heat than the second semiconductor elements 4 on the lead 2A. The lead 1A is presumed to cause the peeling of the sealing resin 7 more easily due to heat generation, and thus increasing the arrangement density of the plurality of recesses 1111A at the lead 1A can suppress the peeling of the sealing resin 7.

As shown in FIGS. 3 and 8, the first semiconductor elements 3 and the third semiconductor elements 5 are surrounded by the grooves 1112A and the grooves 1113A. This can prevent the bonding layers 39 and the bonding layers 59 that bond the first semiconductor elements 3 and the third semiconductor elements 5 from spreading to their peripheries during the manufacturing process.

FIG. 3 shows an example of the arrangement of the fixing members 83 with respect to the semiconductor device A1 by using an imaginary line. The illustrated example is the case where the fixing members 83 include bolts and washers, and shows the areas occupied by these washers. The size of each fixing member 83 including the washer is not particularly limited, and FIG. 3 shows an example where the dimension of the sealing resin 7 in the x direction is 37 mm, the dimension thereof in the y direction is 23 mm, and the diameter of each washer is 8 mm. In the illustrated example, the fixing members 83 intersect with the supporting member first surface 63 and supporting member second surface 64 of the supporting member 6 as viewed in the z direction. In the illustrated example, the fixing members 83 intersect with the first surface 121A of the lead 1A and the second surface 122D of the lead 1D as viewed in the z direction. In such an example, the fastening force of the corresponding fixing member 83 tends to act on the first surface 121A, and the plurality of protruding areas 131A and the plurality of recessed areas 132A effectively prevent the peeling of the sealing resin 7. As for the second surface 122D, a portion of the fourth portion 104G of the lead 1G is located within the third area S3. Such a structure is expected to prevent the fastening force from acting on the second surface 122D, and to prevent the formation of cracks in the sealing resin 7, beginning from the second surface 122D.

FIGS. 22 to 26 show variations and other embodiments of the present disclosure. In these figures, elements that are the same as or similar to those in the above embodiment are provided with the same reference signs as in the above embodiment.

First Variation of First Embodiment; Semiconductor Device A11

Figure 22:
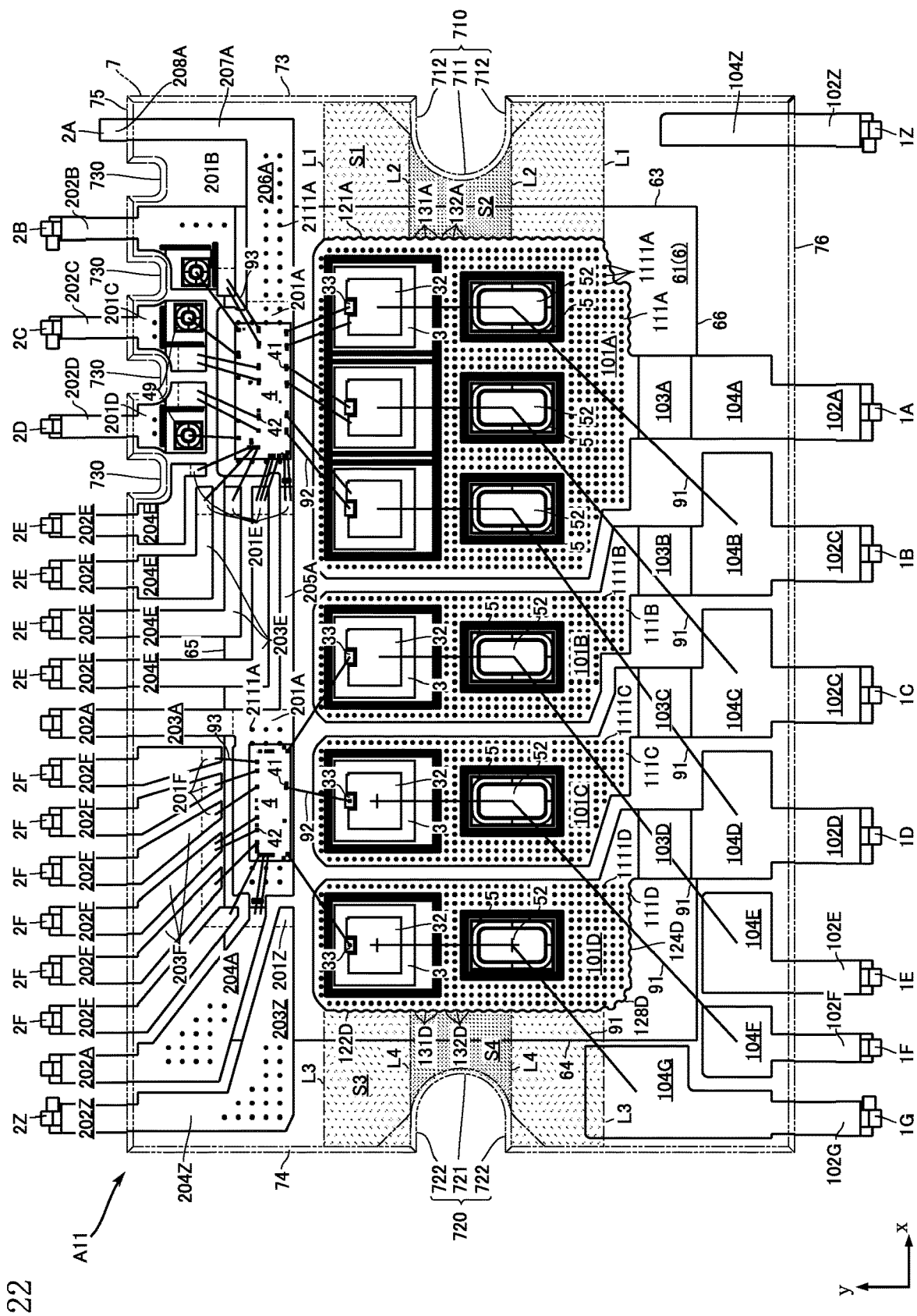
FIG. 22 is a view for describing a first variation of the semiconductor device according to the first embodiment.

FIG. 22 shows a first variation of the semiconductor device A1. In a semiconductor device A11 in FIG. 22, the first portion 101D of the lead 1D is provided with a plurality of protruding areas 131D and a plurality of recessed areas 132D. The plurality of protruding areas 131D and the plurality of recessed areas 132D have the same structures as the plurality of protruding areas 131A and the plurality of recessed areas 132A described above.

In the present variation, the plurality of protruding areas 131D and the plurality of recessed areas 132D are formed at the second surface 122D, fourth surface 124D, and eighth surface 128D of the first portion 101D. In other words, the plurality of protruding areas 131D and the plurality of recessed areas 132D are adjacent to the third area S3 and the fourth area S4.

The present variation can also improve the reliability of the sealing resin 7. Furthermore, the present variation can prevent the formation of cracks in the sealing resin 7, beginning from the second surface 122D.

Second Variation of First Embodiment; Semiconductor Device A12

Figure 23:
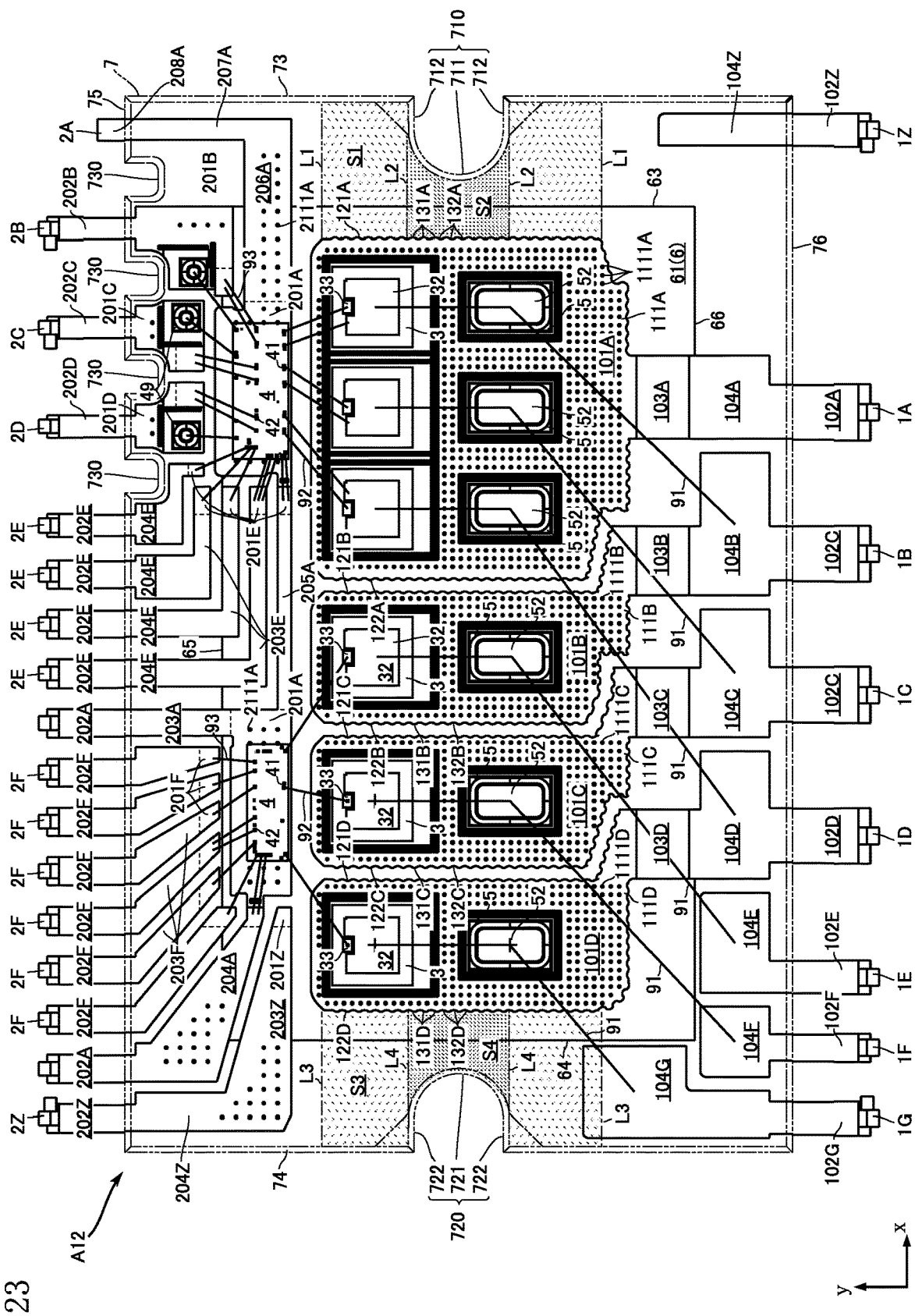
FIG. 23 is a view for describing a second variation of the semiconductor device according to the first embodiment.
Figure 24:
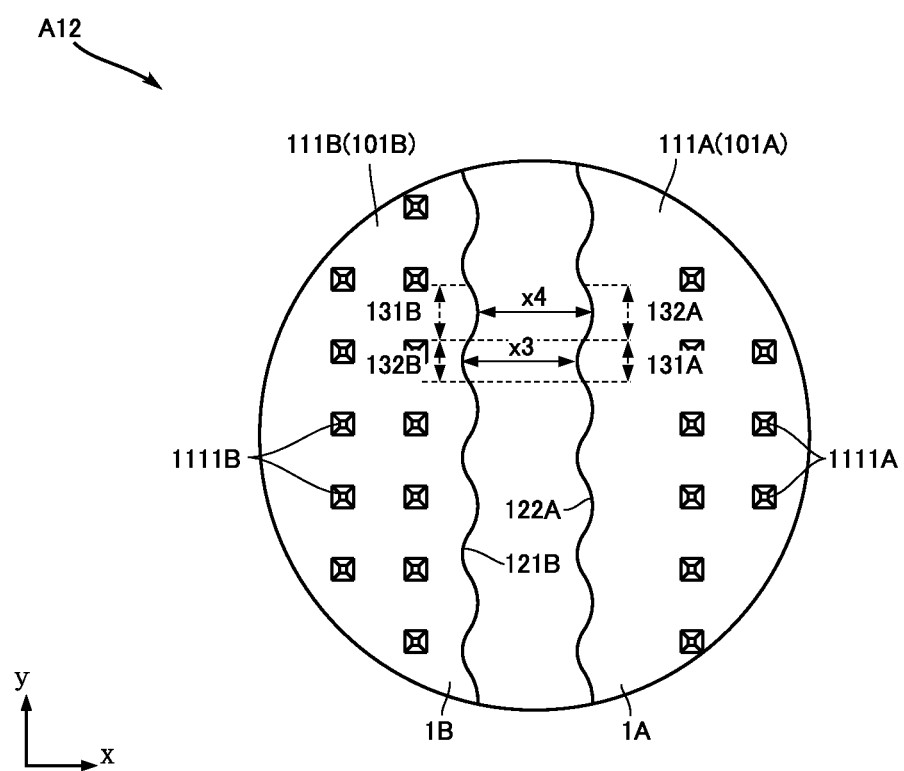
FIG. 24 is a plan view for describing the second variation of the semiconductor device according to the first embodiment.

FIGS. 23 and 24 show a second variation of the semiconductor device A1. In a semiconductor device A12 shown the figures, the surfaces of the first portions 101A, 101B, 101C, and 101D that define the shapes of these portions as viewed in the z direction, except the third surfaces 123A, 123B, 123C, and 123D, are provided with a plurality of protruding areas 131A, 131B, 131C, and 131D and a plurality of recessed areas 132A, 132B, 132C, and 132D. The plurality of protruding areas 131B, 131C and the plurality of recessed areas 132B, 132C have the same structures as the plurality of protruding areas 131A and the plurality of recessed areas 132A described above.

FIG. 24 shows the lead 1A and the lead 1B as an example of leads 1 that are adjacent to each other. The plurality of protruding areas 131A and the plurality of recessed areas 132A that are provided for the second surface 122A and the plurality of protruding areas 131B and the plurality of recessed areas 132B that are provided for the first surface 121B are arranged parallel to each other. In other words, as viewed in the x direction, the protruding areas 131A and the recessed areas 132B overlap with each other, and the recessed areas 132A and the protruding areas 131B overlap with each other. A dimension x3, which is the distance between the protruding areas 131A and the recessed areas 132B, and a dimension x4, which is the distance between the recessed areas 132A and the protruding areas 131B, are the same. When the dimension x3 and the dimension x4 are the same, a relationship is established in which, for example, the dimension x3 and the dimension x4 are both larger than a dimension x5 that is the smallest dimension between the protruding areas 131A and the protruding areas 131B in the x direction, and are both smaller than a dimension x6 that is the largest dimension between the recessed areas 132A and the recessed areas 132B in the x direction.

The present variation can also improve the reliability of the sealing resin 7. Furthermore, the present variation can prevent the formation of cracks in the sealing resin 7 over wider areas of the first portions 101A, 101B, 101C, and 101D. As shown in FIG. 24, since the second surface 122A and the first surface 121B, which are adjacent to each other, are roughly parallel to each other, it is possible to suppress the formation of cracks while avoiding adjacent portions of the first portion 101A and the first portion 101B from being unreasonably close to each other.

Third Variation of First Embodiment; Semiconductor Device A13

Figure 25:
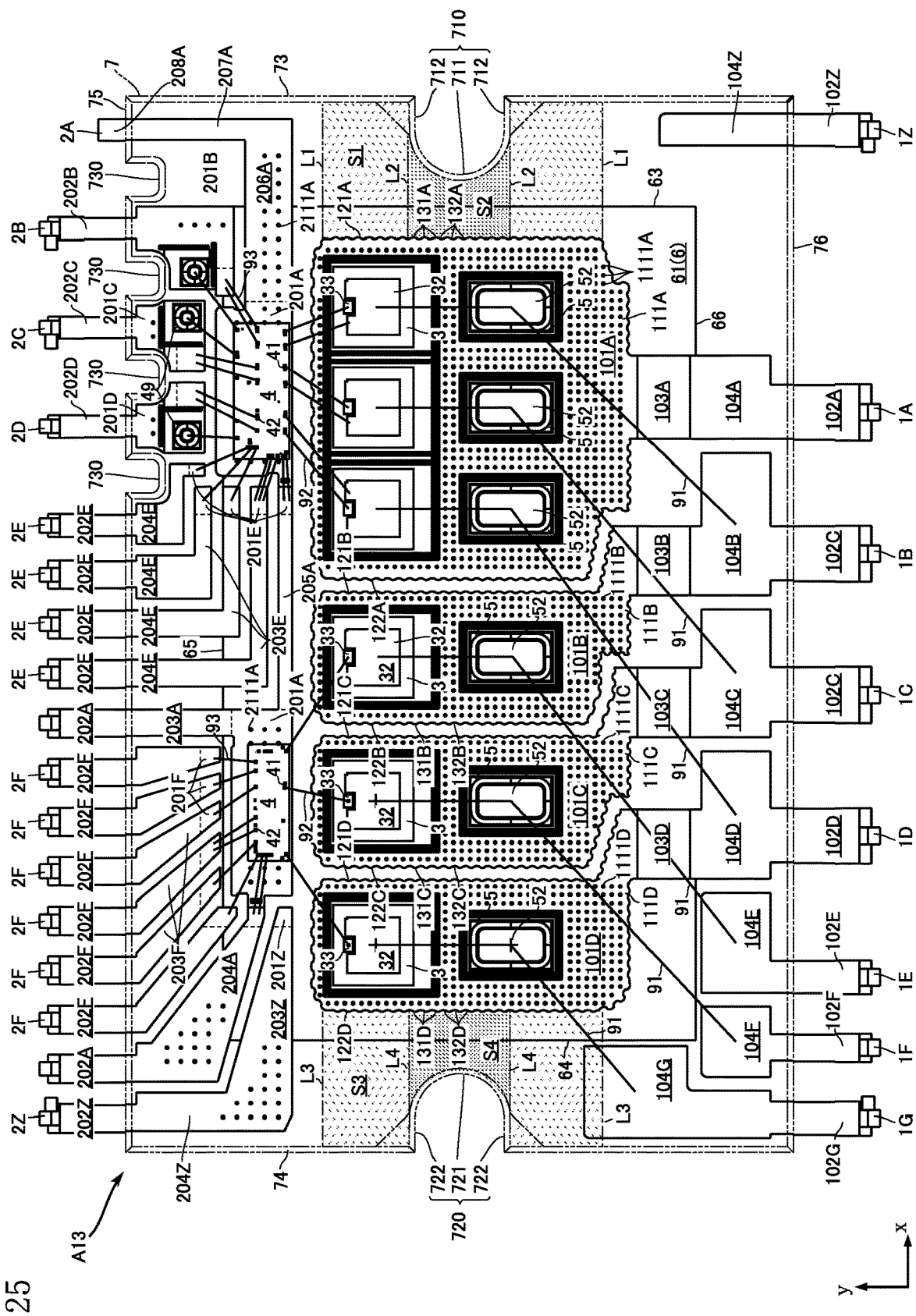
FIG. 25 is a view for describing a third variation of the semiconductor device according to the first embodiment.

FIG. 25 shows a third variation of the semiconductor device A1. In a semiconductor device A13 shown in FIG. 25, all surfaces of the first portions 101A, 101B, 101C, and 101D that define the shapes of these portions as viewed in the z direction are provided with a plurality of protruding areas 131A, 131B, 131C, and 131D and a plurality of recessed areas 132A, 132B, 132C, and 132D.

The present variation can also improve the reliability of the sealing resin 7. Furthermore, the present variation can prevent the formation of cracks in the sealing resin 7 over even wider areas of the first portions 101A, 101B, 101C, and 101D.

Second Embodiment; Semiconductor Device A2

Figure 26:
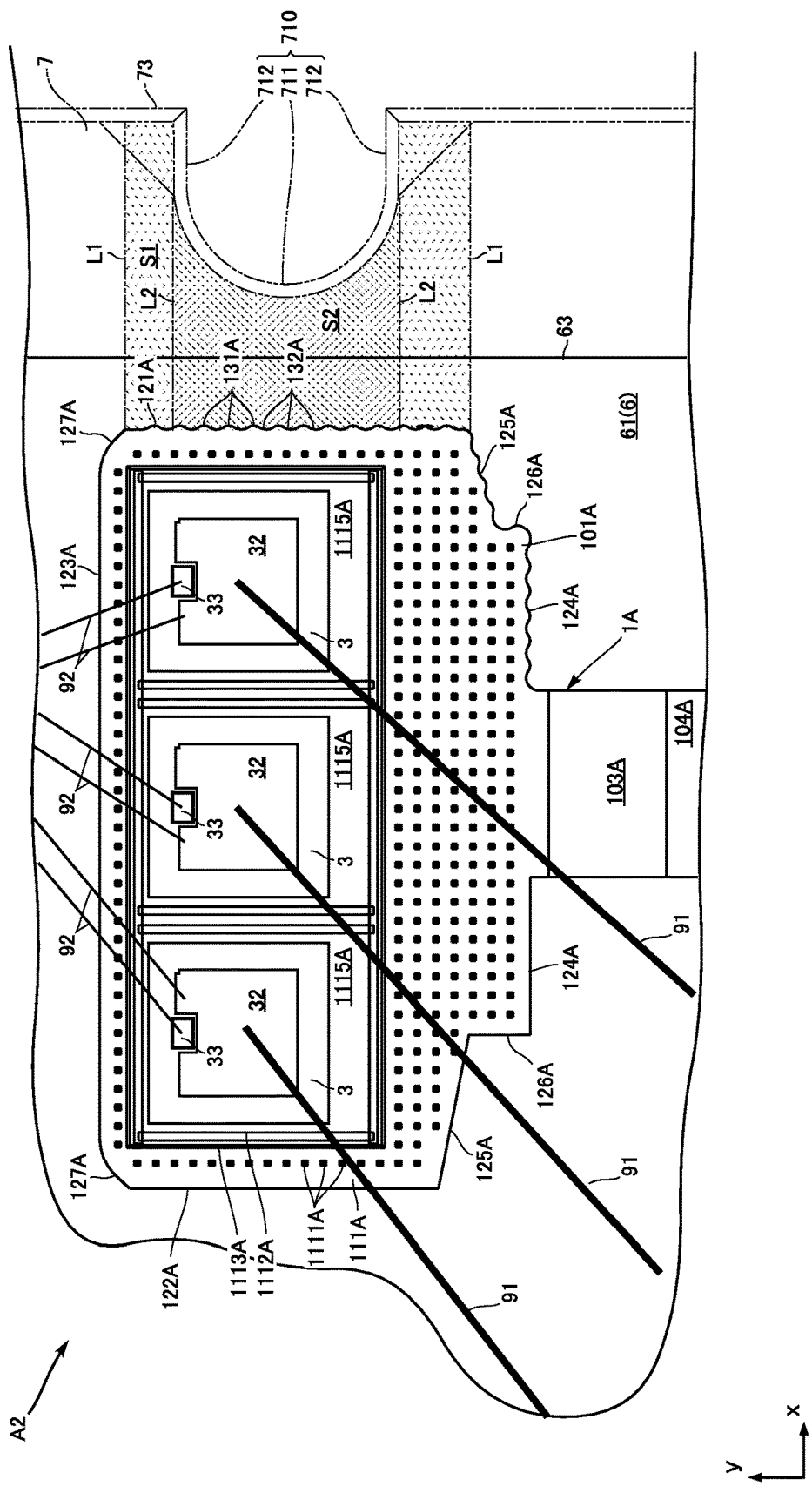
FIG. 26 is a plan view for describing a semiconductor device according to a second embodiment.

FIG. 26 shows a semiconductor device according to a second embodiment of the present disclosure. A semiconductor device A2 shown in FIG. 26 is different from that in the above embodiment in the configurations of the first semiconductor elements 3.

The first semiconductor elements 3 of the present embodiment are MOSFETs made of SiC, for example. Each of the first semiconductor elements 3 has a first electrode 31, a second electrode 32, and a third electrode 33, and has a built-in portion that has a function equivalent to that of the third semiconductor elements 5 described above. Accordingly, the semiconductor device A2 does not include any third semiconductor element 5.

Since the semiconductor device A2 does not include any third semiconductor element 5, the first portion 101A has a structure different from that in the above embodiment. The first portion 101A is not provided with the areas 1116A described above. The dimension of the first portion 101A in the y direction is smaller than the dimension of the first portion 101A in the above embodiment in the y direction. Note that each of the first portions 101B, 101C, and 101D may also have the same structure as the first portion 101A to correspond to the configurations of the first semiconductor elements 3.

The present embodiment is expected to have the same advantages as the above embodiment, and can improve the reliability of the sealing resin 7. Furthermore, the present embodiment can reduce the dimension of the entire semiconductor device A2 in the y direction, which is advantageous for miniaturization.

The semiconductor device and the mounting structure thereof according to the present disclosure are not limited to those in the above embodiments. Various design changes can be made to the specific structures of the elements of the semiconductor device and the mounting structure thereof.

Clause 1. A semiconductor device comprising:
a first lead;
a first semiconductor element; and
a sealing resin covering at least a portion of each of the first lead and the first semiconductor element,
wherein the first lead includes a first lead first portion that has: a first lead obverse surface on which the first semiconductor element is mounted; a first lead reverse surface opposite to the first lead obverse surface; and a first lead first surface located between the first lead obverse surface and the first lead reverse surface in a thickness direction in which the first lead obverse surface and the first lead reverse surface are separated apart from each other,
the first semiconductor element is mounted on the first lead obverse surface, and
the first lead first surface is covered with the sealing resin, and is formed with a plurality of protruding areas and a plurality of recessed areas arranged alternately as viewed in the thickness direction.

Clause 2. The semiconductor device according to clause 1, further comprising a supporting member to which the first lead reverse surface of the first lead is fixed.

Clause 3. The semiconductor device according to clause 2, wherein the sealing resin has a resin obverse surface facing the same side as the first lead obverse surface, a resin reverse surface facing the same side as the first lead reverse surface, and a resin first surface located between the resin obverse surface and the resin reverse surface in the thickness direction and separated apart from the first lead first surface in a first direction that is perpendicular to the thickness direction.

Clause 4. The semiconductor device according to clause 3, wherein the first lead first surface is closest to the resin first surface among surfaces of the first lead.

Clause 5. The semiconductor device of clause 4, wherein the lead is provided in an area avoiding a first area that is surrounded by the first lead first surface, the resin first surface, and a pair of first virtual lines that extend along a first direction from respective ends of the first lead first surface to the resin first surface as viewed in the thickness direction.

Clause 6. The semiconductor device according to clause 5, wherein the sealing resin has a resin first recess that is recessed from the resin first surface toward the first lead first surface as viewed in the thickness direction.

Clause 7. The semiconductor device according to clause 6, wherein the resin first recess surrounds the first area, together with the first lead first surface, the resin first surface, and the pair of first virtual lines, as viewed in the thickness direction.

Clause 8. The semiconductor device according to any of clauses 3 to 7, wherein
the supporting member has a supporting member obverse surface facing the same side as the first lead obverse surface and to which the first lead reverse surface is fixed, a supporting member reverse surface facing a side opposite from the supporting member obverse surface, and a supporting member first surface located between the supporting member obverse surface and the supporting member reverse surface in the thickness direction, and
the supporting member first surface is located between the first lead first surface and the resin first surface in the thickness direction.

Clause 9. The semiconductor device according to any of clauses 3 to 8, wherein
the first lead first surface has a first surface first area and a first surface second area that are adjacent to each other in a thickness direction, and
the first surface first area is rougher than the first surface second area.

Clause 10. The semiconductor device according to clause 9, wherein the first surface first area is located closer to the first lead obverse surface than is the first surface second area.

Clause 11. The semiconductor device according to clause 10, wherein the first lead has a first protrusion located between the first lead obverse surface and the first surface first area and protruding from the first lead obverse surface in the thickness direction.

Clause 12. The semiconductor device according to clause 10 or 11, wherein
the first lead reverse surface includes a reverse surface first portion and a reverse surface second portion, the reverse surface first portion including a portion that overlaps with the first semiconductor element as viewed in a thickness direction, the reverse surface second portion being surrounded by the first lead first surface and a line segment connecting bottoms of adjacent ones of the recessed areas as viewed in the thickness direction, and
the reverse surface second portion is inclined toward the first lead obverse surface in the thickness direction with increasing distance from the reverse surface first portion in the first direction.

Clause 13. The semiconductor device according to any of clauses 2 to 12, wherein a radius of curvature of each of the protruding areas is smaller than a radius of curvature of each of the recessed areas.

Clause 14. The semiconductor device according to any of clauses 2 to 13, wherein the plurality of protruding areas and the plurality of recessed areas are provided across an entirety of the first lead first surface in a thickness direction.

clause 15. The semiconductor device according to any of clauses 2 to 14, further comprising:
a second semiconductor element for controlling the first semiconductor element; and a second lead on which the second semiconductor element is mounted, wherein
a voltage applied to the first lead is higher than a voltage applied to the second lead.

Clause 16. The semiconductor device according to clause 15, wherein the second lead has a second lead first portion on which the second semiconductor element is mounted, and
the second lead first portion is offset from the first lead first portion in the thickness direction toward a side that the first lead obverse surface faces.

Clause 17. The semiconductor device according to clause 15 or 16, wherein the first lead and the second lead are separated from each other in a second direction that is perpendicular to both of the thickness direction and the first direction,
the first lead has a first lead second portion protruding from the sealing resin to a side opposite from the second lead in the second direction, and the second lead has a second lead second portion protruding from the sealing resin to a side opposite from the first lead in the second direction.

Clause 18. A mounting structure of a semiconductor device, comprising:
a semiconductor device according to any of clauses 1 to 17;
a mount member on which the semiconductor device is mounted;
an interposing member interposed between the supporting member of the semiconductor device and the mount member; and
a fixing member that fixes the semiconductor device and the mount member with the interposing member therebetween.

The invention claimed is:
1. A semiconductor device comprising:
a first lead;
a first semiconductor element; and
a sealing resin covering at least a portion of each of the first lead and the first semiconductor element, wherein the first lead includes a first lead first portion that has:
a first lead obverse surface on which the first semiconductor element is mounted;
a first lead reverse surface opposite to the first lead obverse surface; and
a first lead first surface located between the first lead obverse surface and the first lead reverse surface in a thickness direction in which the first lead obverse surface and the first lead reverse surface are separated apart from each other,
the first lead first surface is covered with the sealing resin, and is formed with a plurality of protruding areas and a plurality of recessed areas arranged alternately as viewed in the thickness direction, and
a radius of curvature of each of the protruding areas is smaller than a radius of curvature of each of the recessed areas.
2. The semiconductor device according to claim 1, further comprising a supporting member to which the first lead reverse surface of the first lead is fixed.
3. The semiconductor device according to claim 2, wherein the sealing resin has a resin obverse surface facing a same side as the first lead obverse surface does, a resin reverse surface facing a same side as the first lead reverse surface does, and a resin first surface located between the resin obverse surface and the resin reverse surface in the thickness direction and separated apart from the first lead first surface in a first direction perpendicular to the thickness direction.
4. The semiconductor device according to claim 3, wherein the first lead first surface is closest to the resin first surface among surfaces of the first lead.
5. The semiconductor device of claim 4, wherein the lead is provided in an area avoiding a first area that is surrounded by the first lead first surface, the resin first surface, and a pair of first virtual lines that extend along a first direction from respective ends of the first lead first surface to the resin first surface as viewed in the thickness direction.
6. The semiconductor device according to claim 5, wherein the sealing resin has a resin first recess that is recessed from the resin first surface toward the first lead first surface as viewed in the thickness direction.
7. The semiconductor device according to claim 6, wherein the resin first recess surrounds the first area, together with the first lead first surface, the resin first surface, and the pair of first virtual lines, as viewed in the thickness direction.
8. The semiconductor device according to claim 3, wherein the supporting member has a supporting member obverse surface facing a same side as the first lead obverse surface does and to which the first lead reverse surface is fixed, a supporting member reverse surface facing a side opposite from the supporting member obverse surface, and a supporting member first surface located between the supporting member obverse surface and the supporting member reverse surface in the thickness direction, and the supporting member first surface is located between the first lead first surface and the resin first surface in the thickness direction.
9. The semiconductor device according to claim 2, wherein the plurality of protruding areas and the plurality of recessed areas are provided across an entirety of the first lead first surface in a thickness direction.
10. The semiconductor device according to claim 2, further comprising:
a second semiconductor element for controlling the first semiconductor element; and a second lead on which the second semiconductor element is mounted,
wherein a voltage applied to the first lead is higher than a voltage applied to the second lead.
11. The semiconductor device according to claim 10, wherein the second lead has a second lead first portion on which the second semiconductor element is mounted, and
the second lead first portion is offset from the first lead first portion in the thickness direction toward a side that the first lead obverse surface faces.
12. The semiconductor device according to claim 10, wherein the first lead and the second lead are separated apart from each other in a second direction that is perpendicular to both of the thickness direction and the first direction,
the first lead has a first lead second portion protruding from the sealing resin to a side opposite from the second lead in the second direction, and
the second lead has a second lead second portion protruding from the sealing resin to a side opposite from the first lead in the second direction.
13. A mounting structure of a semiconductor device, comprising:
a semiconductor device according to claim 1;
a mount member on which the semiconductor device is mounted;
an interposing member interposed between the supporting member of the semiconductor device and the mount member; and
a fixing member that fixes the semiconductor device and the mount member with the interposing member therebetween.
14. A semiconductor device according, comprising:
a first lead;
a first semiconductor element;
a sealing resin covering at least a portion of each of the first lead and the first semiconductor element; and
a supporting member to which the first lead reverse surface of the first lead is fixed, wherein
the first lead includes a first lead first portion that has:
a first lead obverse surface on which the first semiconductor element is mounted;
a first lead reverse surface opposite to the first lead obverse surface; and
a first lead first surface located between the first lead obverse surface and the first lead reverse surface in a thickness direction in which the first lead obverse surface and the first lead reverse surface are separated apart from each other, the first lead first surface is covered with the sealing resin, and is formed with a plurality of protruding areas and a plurality of recessed areas arranged alternately as viewed in the thickness direction, the sealing resin has a resin obverse surface facing a same side as the first lead obverse surface does, a resin reverse surface facing a same side as the first lead reverse surface does, and a resin first surface located between the resin obverse surface and the resin reverse surface in the thickness direction and separated apart from the first lead first surface in a first direction perpendicular to the thickness direction, the first lead first surface has a first surface first area and a first surface second area that are adjacent to each other in a thickness direction, and the first surface first area is rougher than the first surface second area.

15. The semiconductor device according to claim 14, wherein the first surface first area is located closer to the first lead obverse surface than is the first surface second area.

16. The semiconductor device according to claim 15, wherein the first lead has a first protrusion located between the first lead obverse surface and the first surface first area and protruding from the first lead obverse surface in the thickness direction.

17. The semiconductor device according to claim 15, wherein the first lead reverse surface includes a reverse surface first portion and a reverse surface second portion, the reverse surface first portion including a portion that overlaps with the first semiconductor element as viewed in a thickness direction, the reverse surface second portion being surrounded by the first lead first surface and a line segment connecting bottoms of adjacent ones of the recessed areas as viewed in the thickness direction, and the reverse surface second portion is inclined toward the first lead obverse surface in the thickness direction with increasing distance from the reverse surface first portion in the first direction.

* * * * *